(12) United States Patent
Freitag et al.

(10) Patent No.: US 7,663,846 B2
(45) Date of Patent: Feb. 16, 2010

(54) MAGNETORESISTIVE SENSOR HAVING AN ENHANCED LEAD OVERLAY DESIGN AND SHAPE ENHANCED PINNING

(75) Inventors: James Mac Freitag, Sunnyvale, CA (US); Kuok San Ho, Santa Clara, CA (US); Mustafa Michael Pinarbasi, Morgan Hill, CA (US); Ching Hwa Tsang, Sunnyvale, CA (US)

(73) Assignee: Hitachi Global Storage Technologies Netherlands B. V., Amsterdam (NL)

( * ) Notice: Subject to any disclaimer, the term of this patent is extended or adjusted under 35 U.S.C. 154(b) by 733 days.

(21) Appl. No.: 11/297,151

(22) Filed: Dec. 7, 2005

(65) Prior Publication Data

US 2007/0127167 A1    Jun. 7, 2007

(51) Int. Cl.
*G11B 5/33* (2006.01)
(52) U.S. Cl. .................................. 360/324.11
(58) Field of Classification Search ........................ None
See application file for complete search history.

(56) References Cited

U.S. PATENT DOCUMENTS

| | | | | |
|---|---|---|---|---|
| 6,873,499 | B2 * | 3/2005 | Lee et al. | 360/321 |
| 6,934,129 | B1 * | 8/2005 | Zhang et al. | 360/322 |
| 7,211,339 | B1 * | 5/2007 | Seagle et al. | 428/815 |
| 7,372,674 | B2 * | 5/2008 | Gill | 360/324.2 |

* cited by examiner

*Primary Examiner*—Mark Blouin
(74) *Attorney, Agent, or Firm*—Zilka-Kotab, PC

(57) ABSTRACT

A magnetoresistive sensor having a lead overlay defined trackwidth and a pinned layer that extends beyond the stripe height defined by the free layer of the sensor. The extended pinned layer has a strong shape induced anisotropy that maintains pinning of the pinned layer moment. The extended portion of the pinned layer has sides beyond the stripe height that are perfectly aligned with the sides of the sensor within the stripe height. This perfect alignment is made possible by a manufacturing method that uses a mask structure for more than one manufacturing phase, eliminating the need for multiple mask alignments. The lead overlay design allows narrow, accurate trackwidth definition.

34 Claims, 26 Drawing Sheets

MAGNETORESISTIVE SENSOR HAVING AN ENHANCED LEAD OVERLAY DESIGN AND SHAPE ENHANCED PINNING

FIELD OF THE INVENTION

The present invention relates to magnetoresistive sensors and more particularly the construction of a magnetoresistive sensor having a pinned layer that is extended in the stripe height direction to increase shape induced magnetic anisotropy and thereby improve pinning, and that has a lead overlay structure for improved trackwidth control and sensor performance.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity has lead a drive to make magnetoresitive sensors ever smaller. For example, designing a sensor with a narrower track width means that more tracks of data can be fit onto a given area of magnetic medium. The various dimensions of a sensor must scale together, so if the trackwidth is decreased, then the stripe height dimension (perpendicular to the ABS) must also be decreased. As sensors become ever smaller, one problem that arises is that the pinned layer becomes impracticably unstable. In fact, future generation sensors will very soon become so small that the pinned layer cannot be adequately pinned by current pinning mechanisms.

It is known that shape can induce magnetic anisotropy in magnetic materials, which can improve the stability of the pinning. Such shape induced anisotropy could be provided by, for example, extending the pinned layer in the stripe height direction (perpendicular to the ABS) so that the pinned layer structure has a narrow deep rectangular structure.

However, the use of such designs has been prevented by such factors as: the limitations on the stripe height dimension of the free layer (to avoid shape induced anisotropy in the wrong direction on the free layer); the need to avoid shunting of sense current across the extended portion of the pinned layer, and also by currently available photolithographic techniques, such as the alignment of multiple mask structures in very small structures.

There are also other challenges to making a sensor with an extremely small track width. For example, currently used biasing mechanisms used for biasing the magnetic moment of the free layer are not desirable for use in extremely narrow sensors. Standard biasing mechanisms include a hard magnetic layer at each side of the sensor. This hard magnetic layer is magnetostatically coupled with the sides of the free layer and this magnetostatic coupling orients the magnetic moment in a desired direction parallel with the ABS. However, as can be appreciated, this biasing is not uniform across the width of the free layer. The sides, where the magnetostatic coupling primarily acts, are strongly biased, or even pinned, while the center portion of the sensor has more freedom to respond to a magnetic field from the medium. As sensors become very narrow, the entire free layer can be pinned by the bias layers and the sensor becomes insensitive to magnetic fields.

In addition, manufacturing processes such as ion milling used to form the sensor stack damage the magnetic layers at the sides of the sensor layer. As sensor track widths become smaller, this damaged portion of the sensor layer becomes a large proportion of the sensor stack, and sensor performance suffers.

Therefore, there is a need for a sensor structure that can provide a high signal output. Such a sensor structure and method of constructing such a sensor structure must overcome the photolithographic and structural challenges faced by current sensor designs.

There is also a strong felt need for a sensor design, and a method of making such a sensor that will provide a strong pinned layer anisotropy perpendicular to the ABS, such as by a design that provides a shape induced anisotropy. Such a design must not, however, result in a significant amount of current shunting. Preferably, a method for manufacturing such a sensor would overcome current photolithographic limitations involved in aligning separate mask structures which has prevented the use of such pinned layer structures.

SUMMARY OF THE INVENTION

The present invention provides a magnetoresistive sensor having a shape enhanced pinned layer that extends in the stripe height direction for increased pinning strength and an enhanced lead overlay design, and a lead overlay structure that improves sensor performance.

The sensor includes a sensor stack with a pinned layer, a free layer and a spacer layer sandwiched between the free and pinned layers. First and second lead layers are formed over the sensor stack, and the distance between the lead layers substantially defines the track width. The sensor stack has a width that is substantially greater than the track width defined by the lead layers. The sensor stack has a back edge that defines a first stripe height (SH1) of the active area of the sensor. A portion of the pinned layer extends beyond the first stripe height SH1 to a second stripe height SH2.

In a possible method of constructing a sensor according to the present invention, a plurality of sensor layers is deposited over a substrate. Then, a mask structure is formed to define the track width of the sensor. Then, an electrically conductive lead material is deposited. Another mask structure that has a width greater than the track width is then formed and an ion mill is performed to remove sensor material at the sides not covered by this mask structure. This second mask structure can also have a back edge that defines the first stripe height (SH1) of the sensor by defining the back edge of the free layer. A thin layer of insulation material is then deposited, followed by a layer of hard bias material. Another mask structure can then be formed having a width less than the previous mask structure, but greater than the track width. With this mask structure in place, another layer of electrically conductive lead material can be deposited to provide improved sense current conductivity.

The method of the present invention provides a sensor having excellent pinned layer pinning, because the pinned layer is extended significantly beyond the active area of the sensor in the stripe height direction. This produces a strong shape enhanced magnetic anisotropy.

The senor also has an advantageous lead overlay design that improves sensor performance by removing the sensor edges away from the active area of the sensor. The effective track width of the sensor is defined by the overlying leads, and the sensor layers extend laterally, substantially beyond the track width. Since the ion milling used to define the edges of the sensor may cause damage to the edges of the sensor layers, moving the sensor edges away from the active area of the sensor ensures that the sensor layers within the active area of the sensor (track width) will be free from damage.

Furthermore, extending the sensor layers beyond the active area of the sensor (beyond the track width) improves free layer sensitivity. Free layers are biased by hard magnetic bias layers at either edge that magnetostatically couple with the edges of the free layer. This results in strong biasing or pinning at the edges and greater free layer sensitivity at the center of the free layer away from the edges. Moving the edges beyond the track width means that the portions of the free layer within the active area or track width will be very sensitive, thereby improving sensor performance, dr/R.

The extended pinned layer has a shape that provides a strong magnetic anisotropy in a direction perpendicular to the ABS as desired to assist pinning. This shape enhanced anisotropy field can be several hundred Oe.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
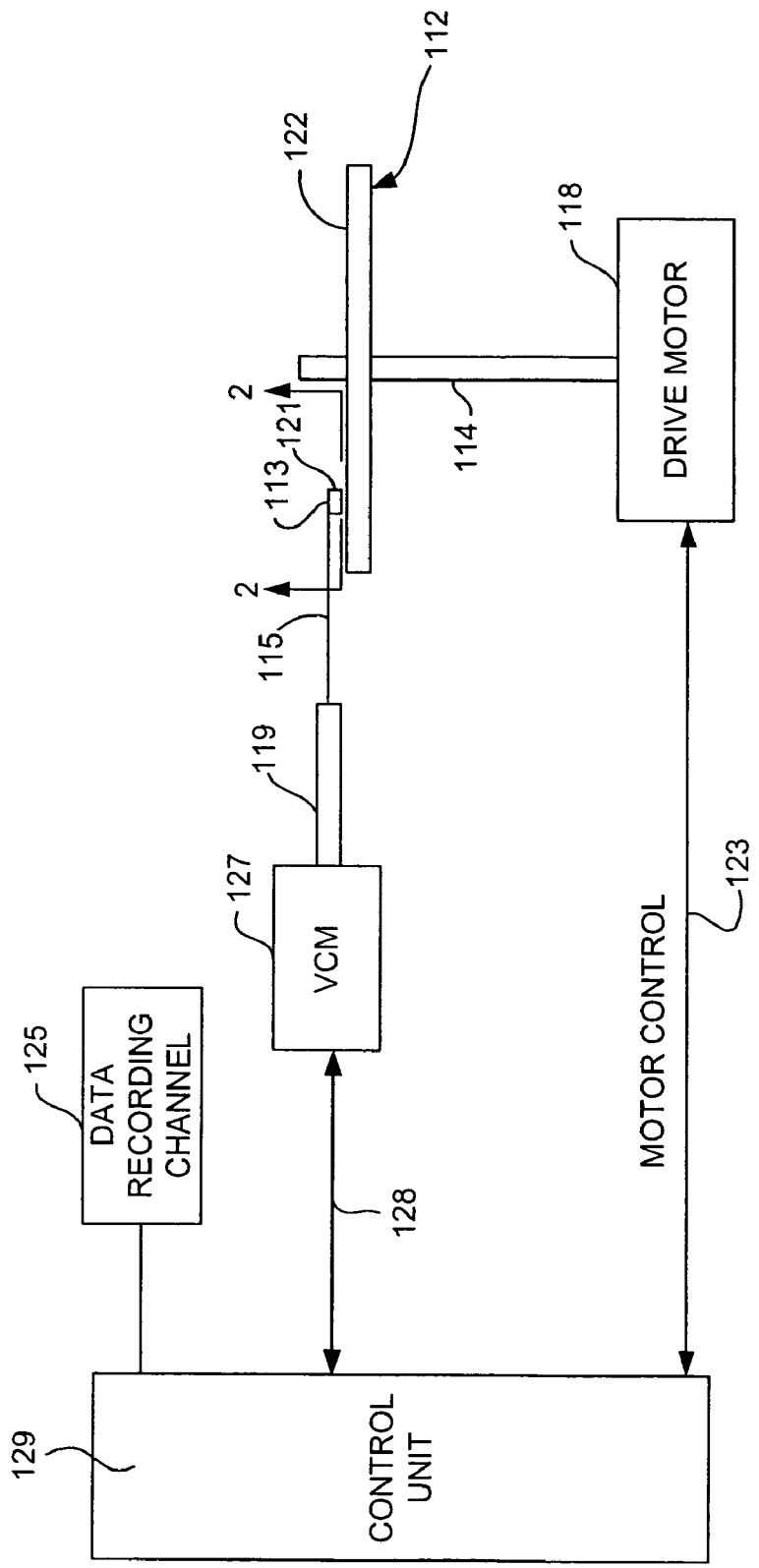
FIG. 1 is a schematic illustration of a disk drive system in which the invention might be embodied.

Referring now to FIG. 1, there is shown a disk drive 100 in which the present invention may be embodied. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
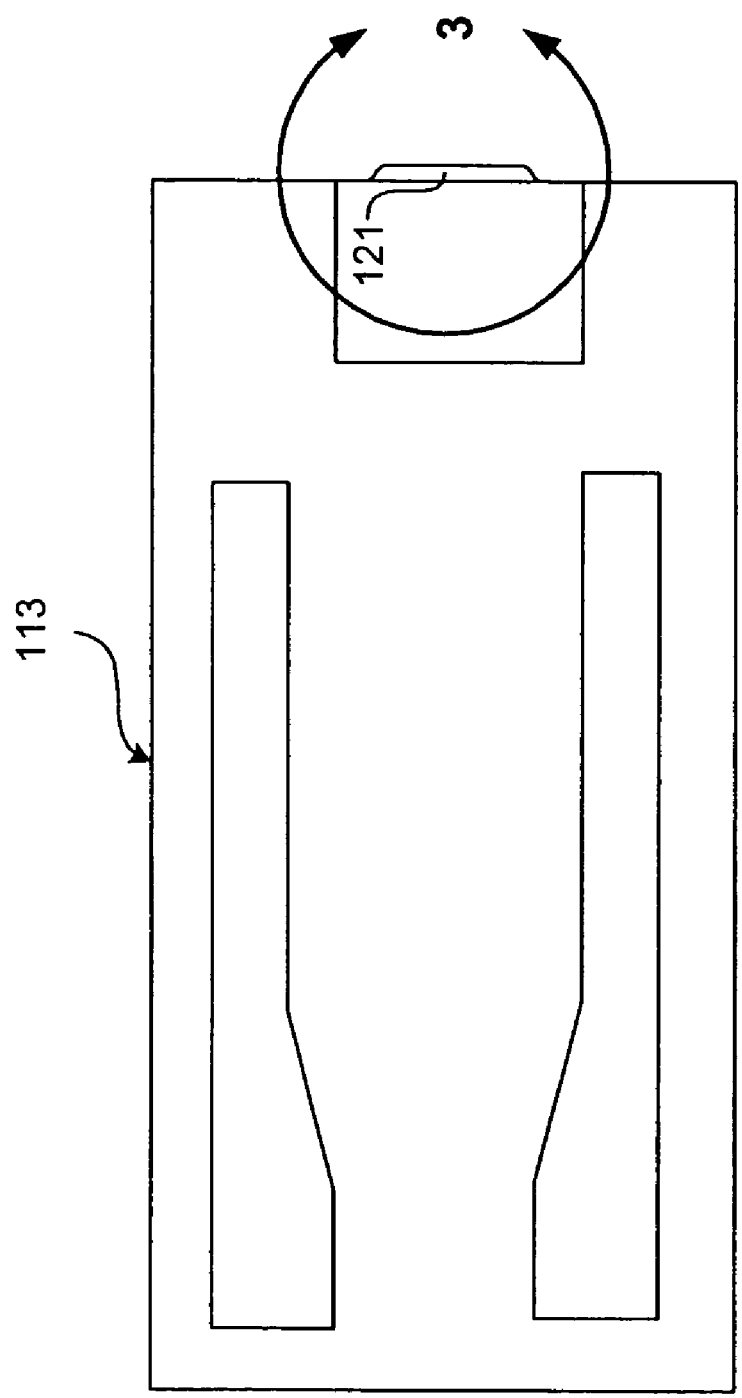
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
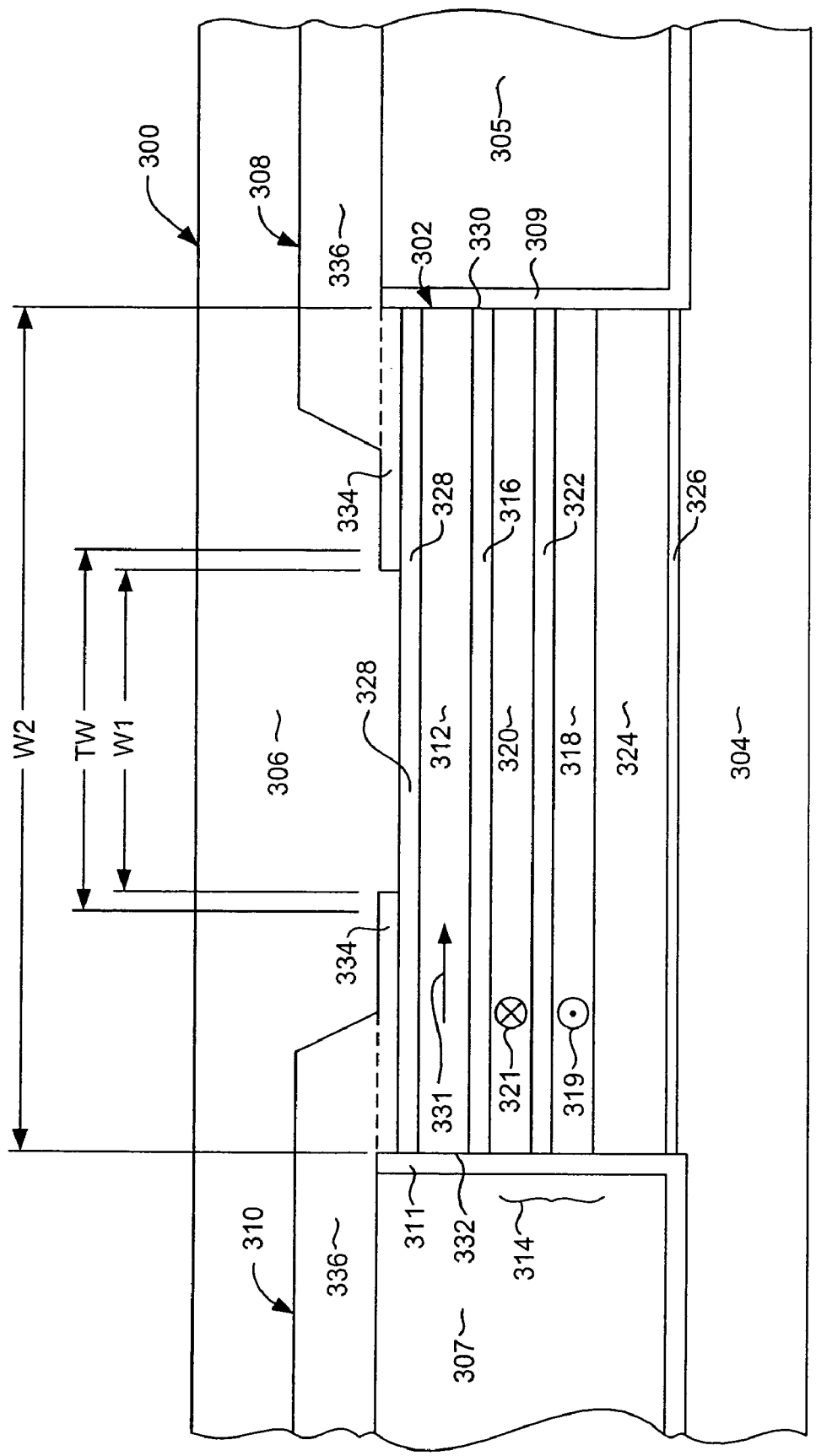
FIG. 3; is an ABS view, taken from circle 3 of FIG. 2 illustrating a sensor according to an embodiment of the invention.

With reference now to FIG. 3, a magnetoresistive sensor 300 according to an embodiment of the invention includes a magnetoresistive sensor element or sensor stack 302, sandwiched between first and second non-magnetic, electrically insulating gap layers 304, 306, which can be constructed of, for example alumina ($Al_2O_3$). First and second hard bias layers (HB) 305, 307 constructed of, for example, CoPtCr are formed at either side of the sensor to provide a magnetic bias field to bias the magnetic moment of the free layer in a direction parallel with the ABS. First and second electrically conductive lead layers 308, 310 are formed above the first and second HB layers, and extend laterally from the sides of the sensor stack 302 between the first and second gap layers 304, 306. Insulation layers 309, 311 prevent current flow from the leads 308, 310 through the sides of the sensor 330, 332. The construction of the leads 308, 310 and insulation layers 309, 311 will be described in greater detail below.

With continued reference to FIG. 3, the sensor stack 302 includes a magnetic free layer 312, a pinned layer structure 314 and a non-magnetic, electrically conductive spacer layer 316, constructed of, for example Cu. The free layer 312 can be constructed of several magnetic materials such as Co, NiFe or CoFe, or of a combination of layers of different magnetic materials.

The pinned layer structure 314 may be a simple pinned structure or an antiparallel pinned (AP pinned) structure, and may be either self pinned or AFM pinned. For purposes of illustration, the pinned layer structure 314, will be described as an AFM pinned, AP pinned layer structure having first and second ferromagnetic layers 318, 320, which are antiparallel coupled across a non-magnetic, electrically conductive AP coupling layer 322 such as Ru. The first and second magnetic layers 318, 320 can be constructed of, for example CoFe, NiFe or some combination of these or other materials. A layer of antiferromagnetic material (AFM layer) 324 is disposed beneath the pinned layer structure 314, and can be for example PtMn, IrMn or some other antiferromagnetic material. The AFM layer 324 is exchange coupled with the first magnetic layer 318 and strongly pins the magnetic moments of the magnetic layers as indicated by symbols 319, 321.

The sensor stack 302 also may include a seed layer 326 formed at the bottom of the sensor stack 302, which can be used to initiate a desired crystalline growth in the layers of the sensor stack 302. A capping layer 328, such as for example Ta or some other suitable material may be provided at the top of the sensor stack 302 to protect the layers of the sensor stack from damage during manufacturing processes such as annealing.

The innermost edges of the leads 308, 310 are separated by a distance W1. The sensor 300 has a track width TW that is substantially defined by the leads 308, 310. Although the actual effective track width TW is defined by the distance W1 between the leads, it is not equal to this width W1, due to the fact that not all of the sense current will enter the sensor stack at the very end of the lead. Therefore, the effective trackwidth of the sensor is wider than W1. The sensor stack 302 has first and second lateral sides 330, 332 that extend significantly beyond W1 and also beyond the effective track width (TW) of the sensor. The distance W2 between the sides 330, 332 of the sensor stack is preferably at least 1.5 times W1 and is preferably 2-4 times W1. The free layer 312 has a magnetic moment 331 that is biased in a desired direction parallel with the ABS. Biasing of the moment 331 is achieved by a bias field provided by the first and second hard bias layers 305, 307.

The leads 308, 310 each include a thin first lead layer 334 (bottom lead) and a thicker second lead layer 336 (top lead). The first thin lead layer 334 extends inward to define the track width TW of the sensor 300. Because, the first lead layers 334 are thin, they can be accurately patterned to a very narrow track width. Forming a thick structure requires the use of a thick mask structure. Because, the first lead layer is thin, it can be patterned using a thin mask structure, resulting in a greatly improved, accurate photolithography. This will be better appreciated upon reading a method for constructing a sensor according to an embodiment of the invention, described herein below. The thicker lead layers 336 provide improved conduction of sense current to the sensor stack 302, and since they do not extend inward to the track width TW, the photolithographic alignment used to pattern the thicker leads 336 is much less critical than the that of the thinner leads 334.

Figure 4:
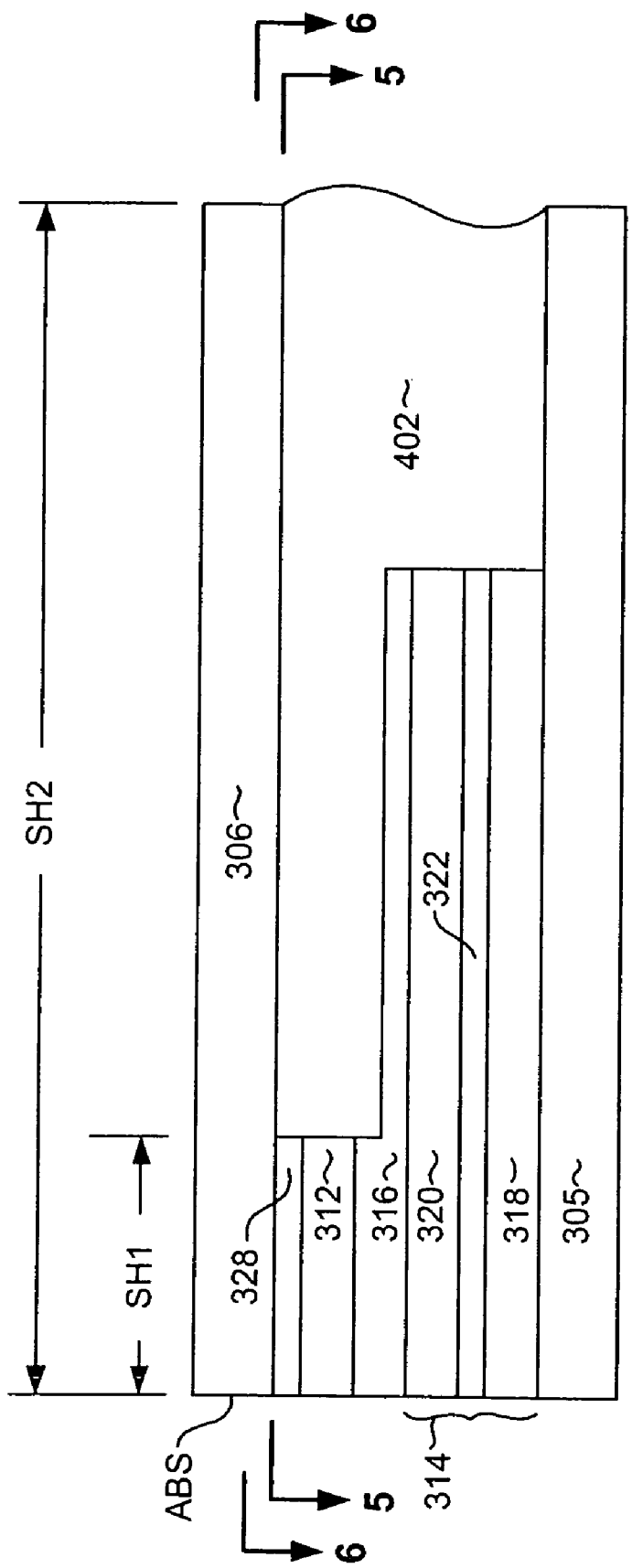
FIG. 4 is a side cross sectional view, taken from line 4-4 of FIG. 3.

With reference to FIG. 4, it can be seen that the free layer 312 extends from the ABS a first stripe height distance SH1, whereas the pinned layer 314 and possibly a portion of the spacer layer 316 extend much further from the ABS to a second stripe height distance SH2. SH2 is preferably at least larger than SH1, and is more preferably at least two times or several times SH1. As those skilled in the art will appreciate, the ABS or air bearing surface is the portion of the head that faces the magnetic medium during operation. As fly heights become ever smaller, the fly height may approach a distance where the head could be considered to be in contact with the medium. Therefore, the term "ABS" should be understood to describe the surface of the head that faces the magnetic medium regardless of the distance from the medium during operation. An insulation fill layer 402 is provided in the area beyond SH1 to fill the space between the gap layers 305, 306 and between the spacer 316 and second gap layer 306.

Figure 5:
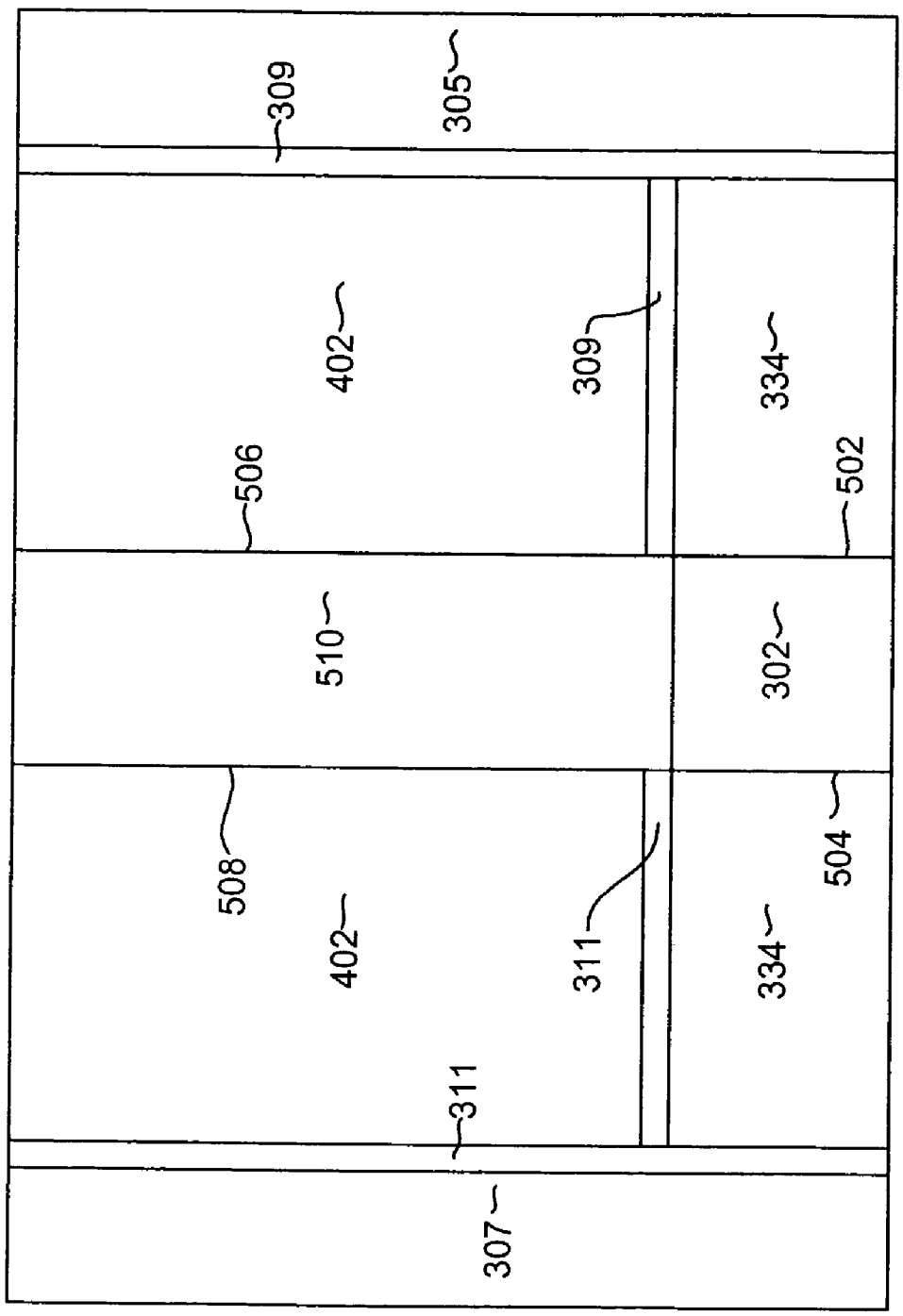
FIG. 5 is a plan view of a sensor according to an embodiment of the invention taken from line 5-5 of FIG. 4.

With reference to FIG. 5, the sensor stack 302 extends laterally beyond the active area of the sensor 300 (as discussed with reference to FIG. 3). Preferably the sensor stack 302 has a width W2 that is at least 1.5 times SH1. More preferably the width W2 is 2-5 times SH1. The pinned layer 314 extends in the stripe height direction as described with reference to FIG. 4. The hard bias layers 305, 307 are separated from the laterally extending portions of the sensor stack 302 by the conformal insulation layers 309, 311. The insulation fill layer 402 fills the space at either side of the pinned layer in the area beyond SH1. The insulation fill layer 402 can be, for example alumina. The insulation layers 309, 311 can also be alumina, but are preferably deposited by a conformal deposition method as will be described in greater detail herein below. The hard bias layers 305, 307 can be constructed of several different hard magnetic materials, such as CoPt or CoPtCr.

Figure 6:
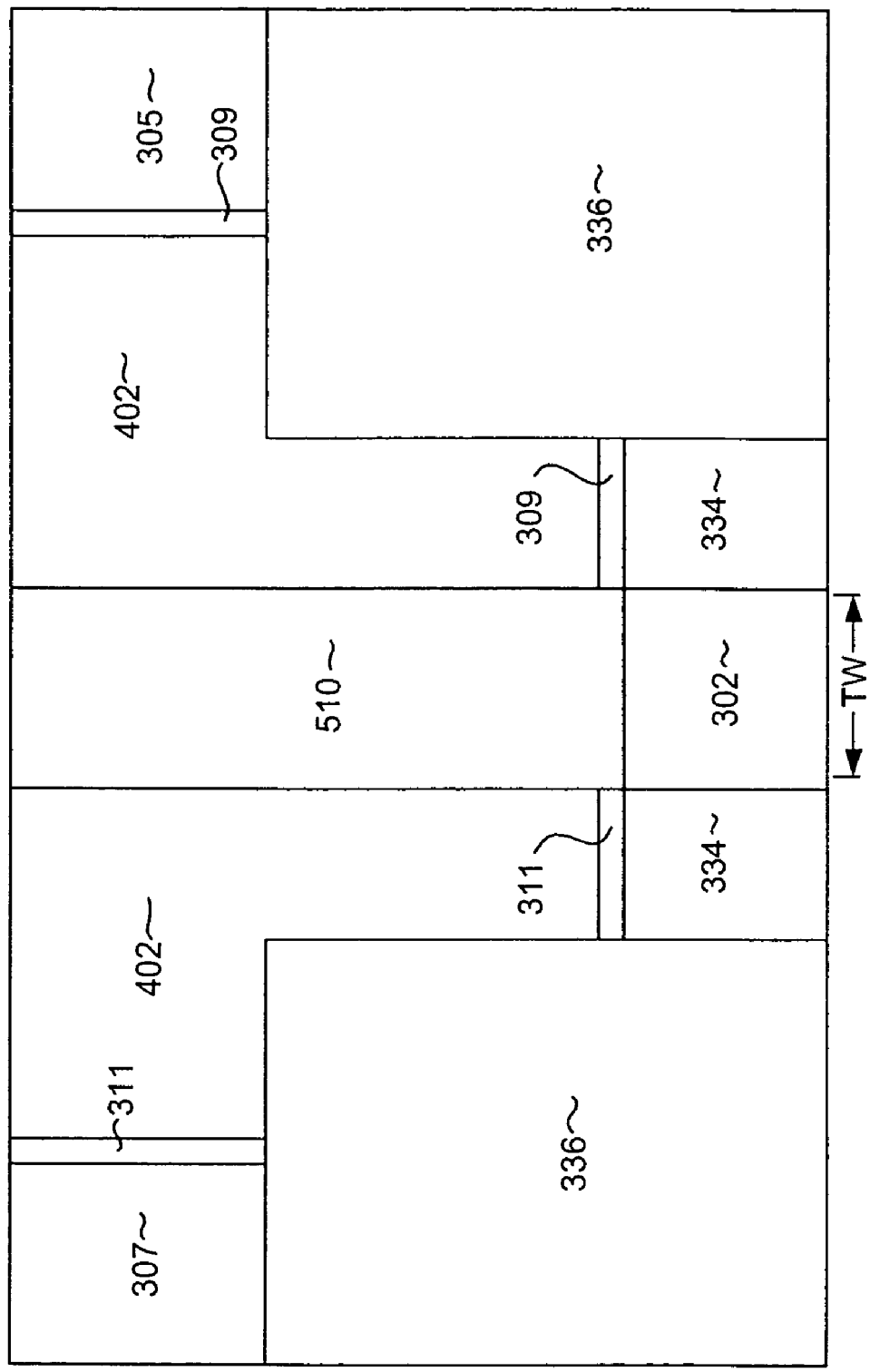
FIG. 6 is a plan view of a sensor according to an embodiment of the invention taken from line 6-6 of FIG. 4.

With continued reference to FIG. 5, the first lead layers 334 can be seen formed over the sensor layers 302. As mentioned above, the leads have inner edges 502, 504 that define the track width (TW) of the sensor. The inner ends 502, 504 of the first thin lead layers 334 may, but need not be, aligned perfectly with the sides 506, 508 of the extended portion 510 of the pinned layer 314 and possibly the spacer 316. A method for constructing the sensor 300 described herein below provides for alignment of the sides 506, 508 of the extended pinned layer 314 with the inner ends 502, 504 of the thin first leads 334. With reference to FIG. 6, the second thicker leads 336 can be seen formed over a portion of the first lead 334 and over a portion of the hard bias layers 305, 307.

Figure 7:
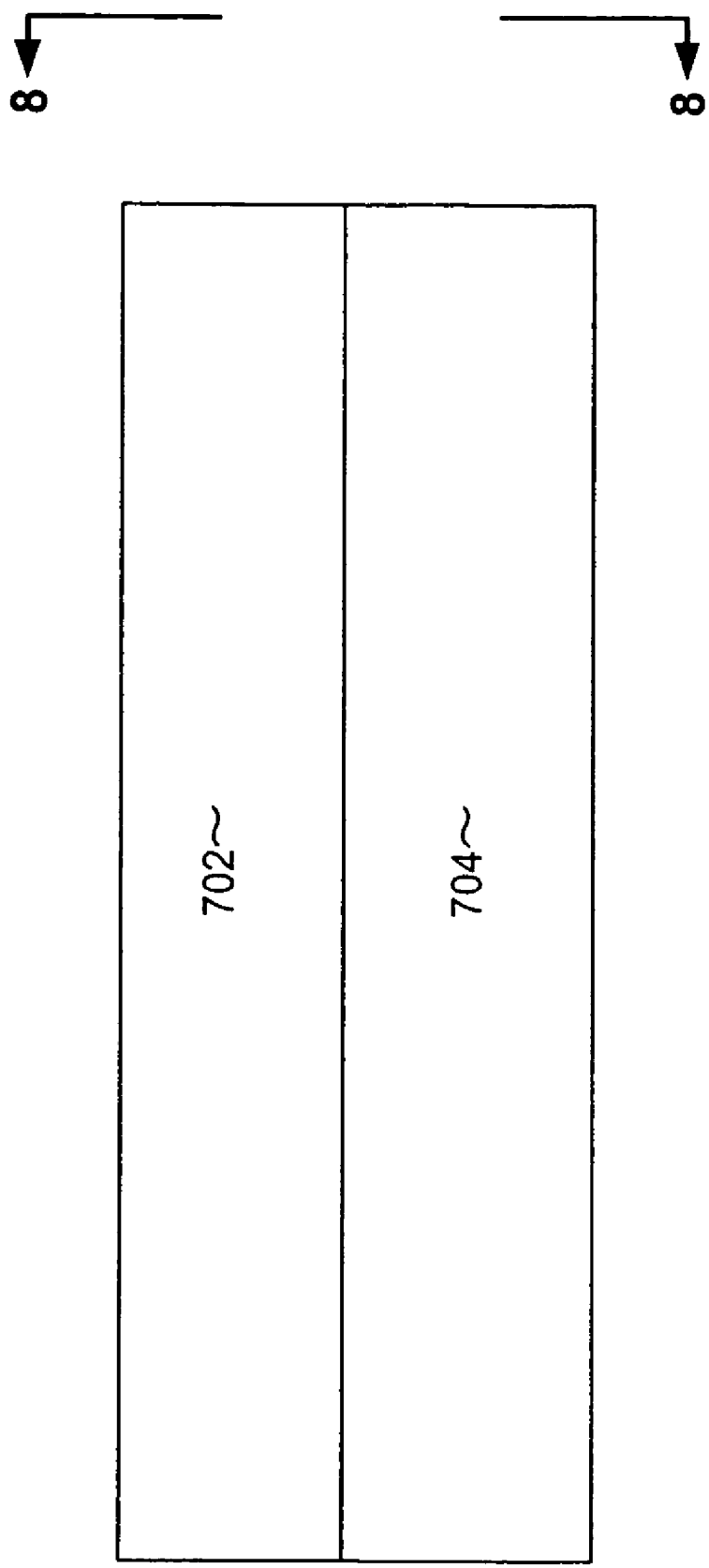
FIGS. 7-21 are views of a magnetoresitive sensor according to an embodiment of the invention, shown in various intermediate stages of manufacture to illustrate a method of manufacturing a device according to an embodiment of the present invention.

With reference now to FIG. 7-20, a method for constructing a sensor 300 according to an embodiment of the invention will be described. With particular reference to FIG. 7, a plurality of sensor layers 702 are deposited full film on a substrate 704, which can be, for example a non-magnetic, electrically insulating gap layer 706. Then, with reference to FIG. 8, a first mask structure 802 is formed over the sensor layers 702. The first mask structure 802 may include a CMP stop layer 804, an image transfer layer such as DURIMIDE® 806 and a photoresist layer 808. The mask structure 802 has a back edge 812 that is disposed away from the location where the future ABS will be formed. This back edge defines a back stripe height of an extended pinned layer portion as will be better understood upon further reading of the described method for constructing a sensor. It should be pointed out that, while the location of the air bearing surface (ABS) is shown in FIG. 8, it is for purposes of illustration only as the ABS will be formed by a lapping processes after the sliders have been cut from the wafer into slider rows as will be familiar to those skilled in the art.

Figure 8:
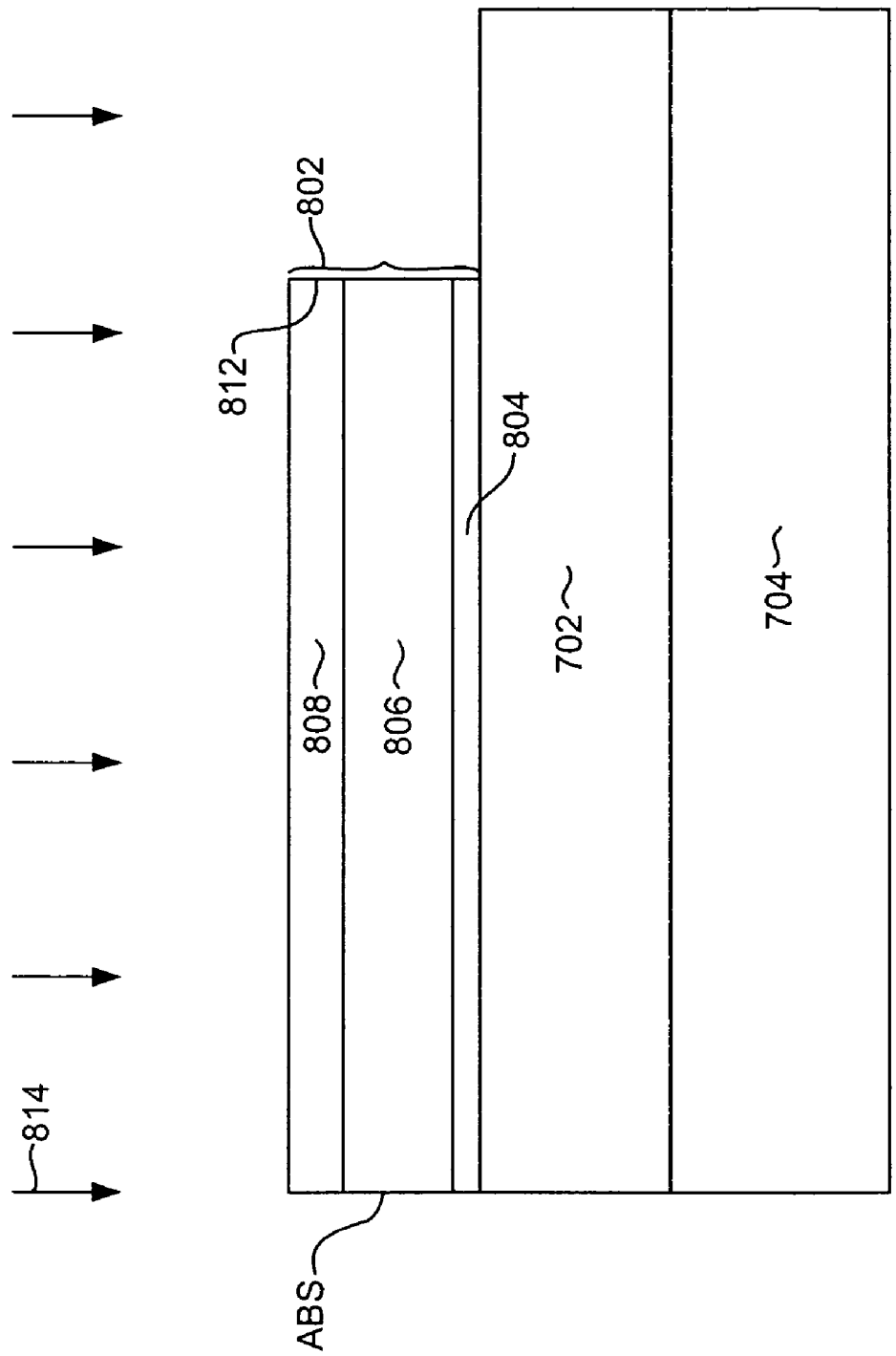
Figure 9:
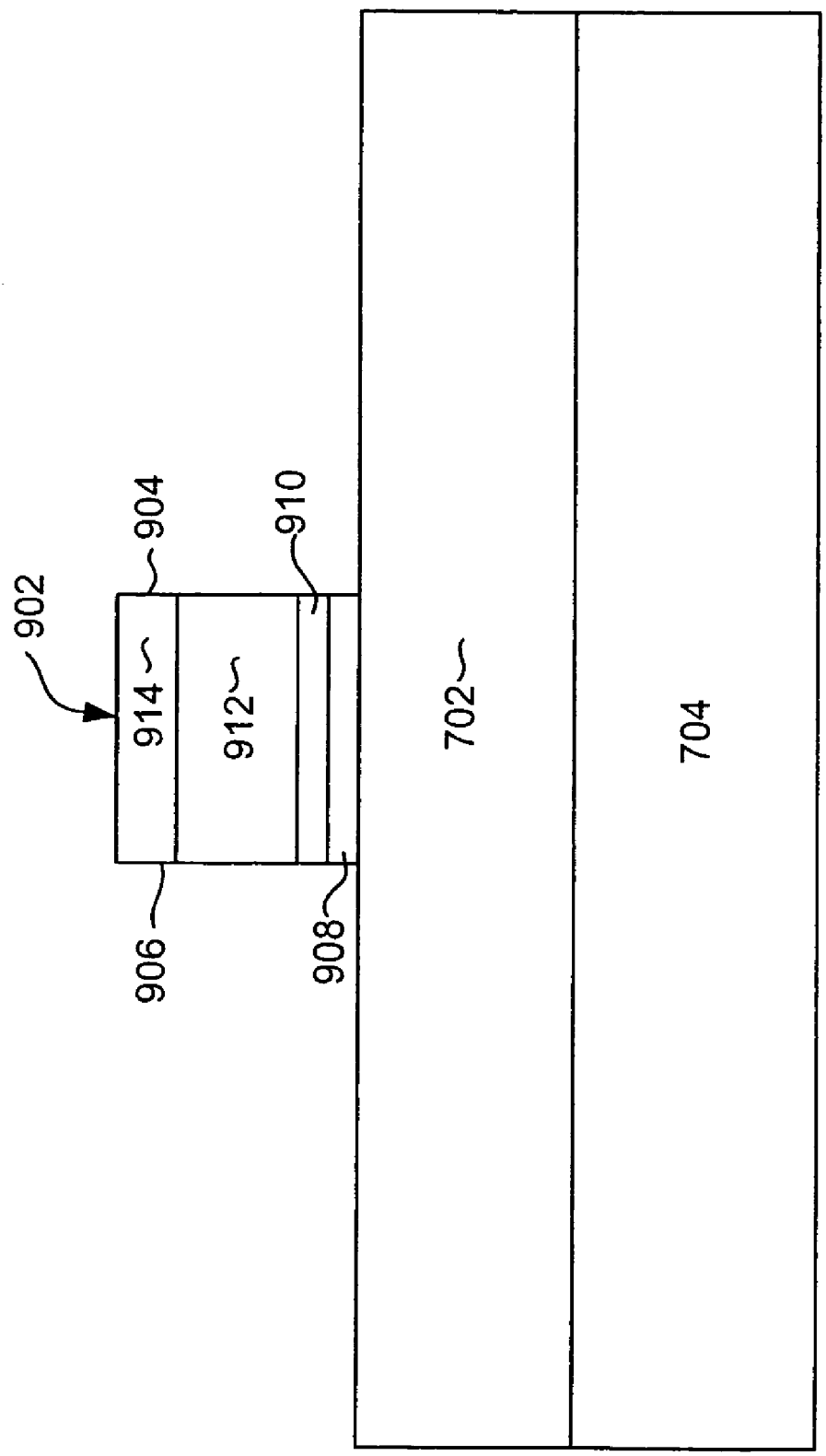

With continued reference to FIG. 8, with the mask 802 in place, an ion mill 814 can be performed to remove portions of the sensor material that are not covered by the mask structure 802. This ion mill defines the back stripe height of the extended pinned layer portion. An insulation fill layer such as alumina (not shown in FIG. 8) can then be deposited and a chemical mechanical polishing process can be performed to planarize the insulation layer. With reference now to FIG. 9, a second mask structure 902, as viewed from the ABS direction in FIG. 9, is formed over the sensor layers. This mask has first and second laterally opposed sides 904, 906 that define the effective track width of the sensor, although the actual effective track width may be wider than the distance between the sides 904, 906, as will be seen.

The second mask structure 902 may include a first layer 908 constructed of a material that is resistant to removal by chemical mechanical polishing (CMP stop layer) 908. This CMP stop layer may be constructed, for example, of diamond like carbon (DLC). A second layer, constructed of a material that is resistant to removal by chemical mechanical polishing and also resistant to removal by reactive ion etching (RIE) is formed over the first layer 908. This second layer (RIE stop layer 910) may be constructed of, for example Rh. An image transfer layer 912 may be formed over the RIE stop layer 910, and may be constructed of DURIMIDE®. A layer of photosensitive material such as photoresist 914 forms the top of the mask structure 902.

The mask structure 902 can be formed by first depositing the layers 908-914 as full film layers. The photoresist layer 914 can then be photolithgoraphically patterned by methods that will be familiar to those skilled in the art. Then, a RIE process can be performed to transfer the image of the photoresist layer 914 onto the image transfer layer 912. A short ion mill can then be performed to remove uncovered portions of the RIE stop layer 910, transferring the image of the layers 912, 914 onto the RIE stop layer 910. Then, another RIE can be performed to transfer the image of the layers 910, 912, 914 onto the CMP stop layer 908.

Figure 10:
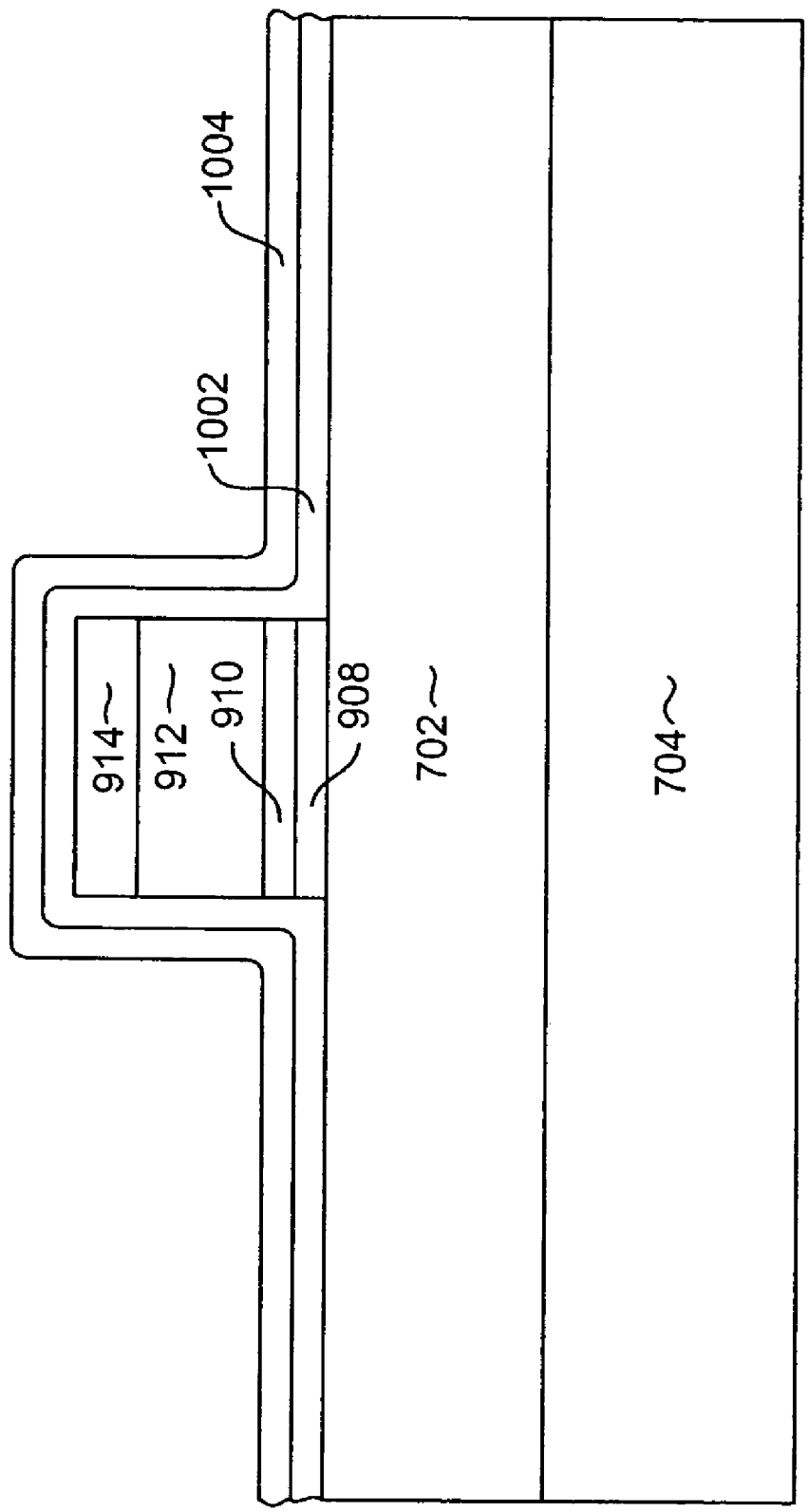
Figure 11:
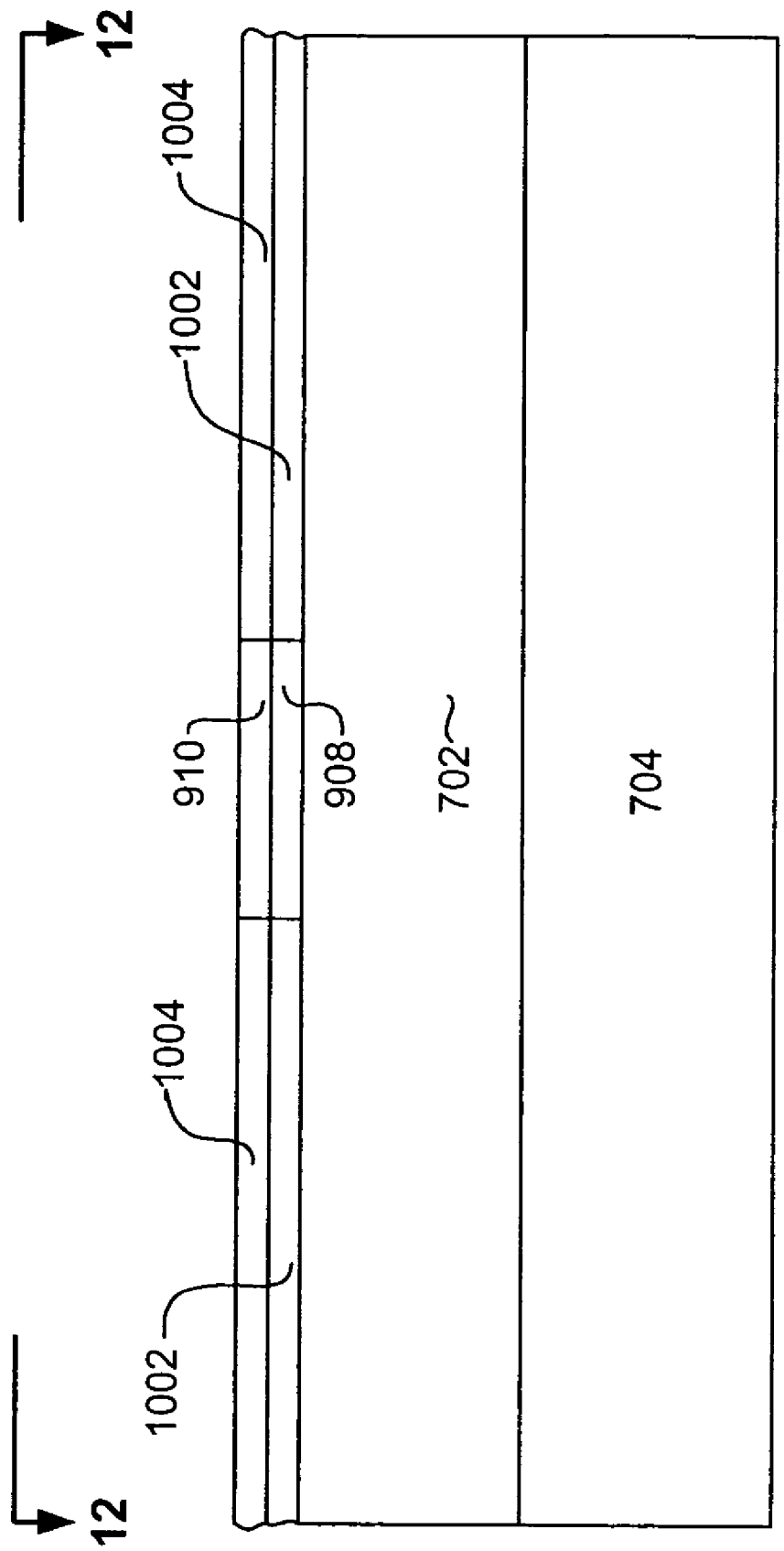
Figure 12:
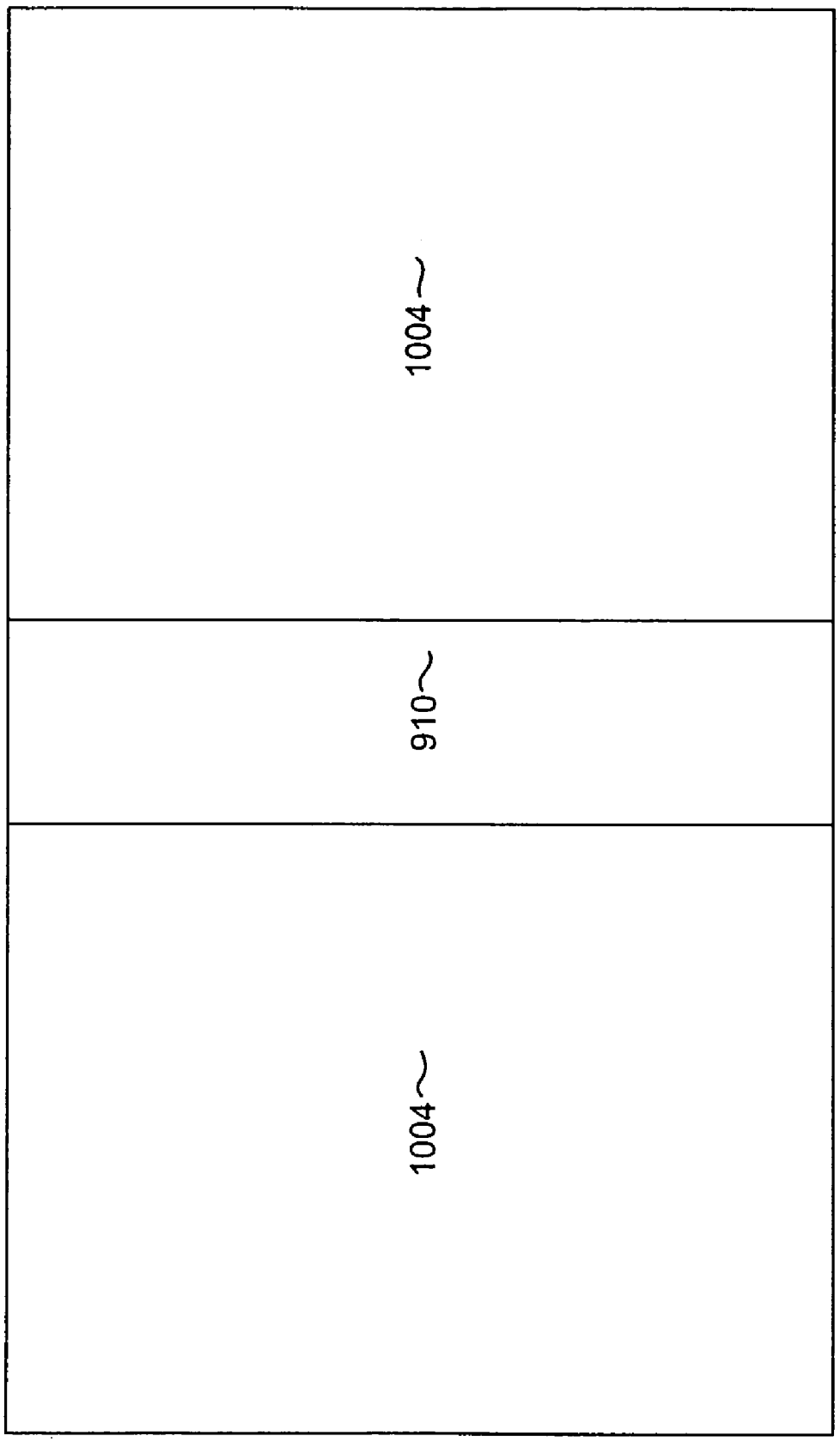

With reference now to FIG. 10, a relatively thin electrically conductive lead material 1002 is deposited full film. A layer of CMP resistant material 1004, such as diamond like carbon (DLC) can then be deposited full film over the electrically conductive lead material 1002. With reference to FIG. 11, a chemical mechanical polishing process (CMP) can be performed to remove portions of the mask structure, with the CMP stop layer 910 and RIE stop layer 908 remaining. The resulting structure can be seen with reference to. FIG. 12, with the RIE stop layer 910 remaining, and CMP stop layer 1004 formed over the thin lead layers covering the rest of the structure 1002 (not shown).

Figure 13:
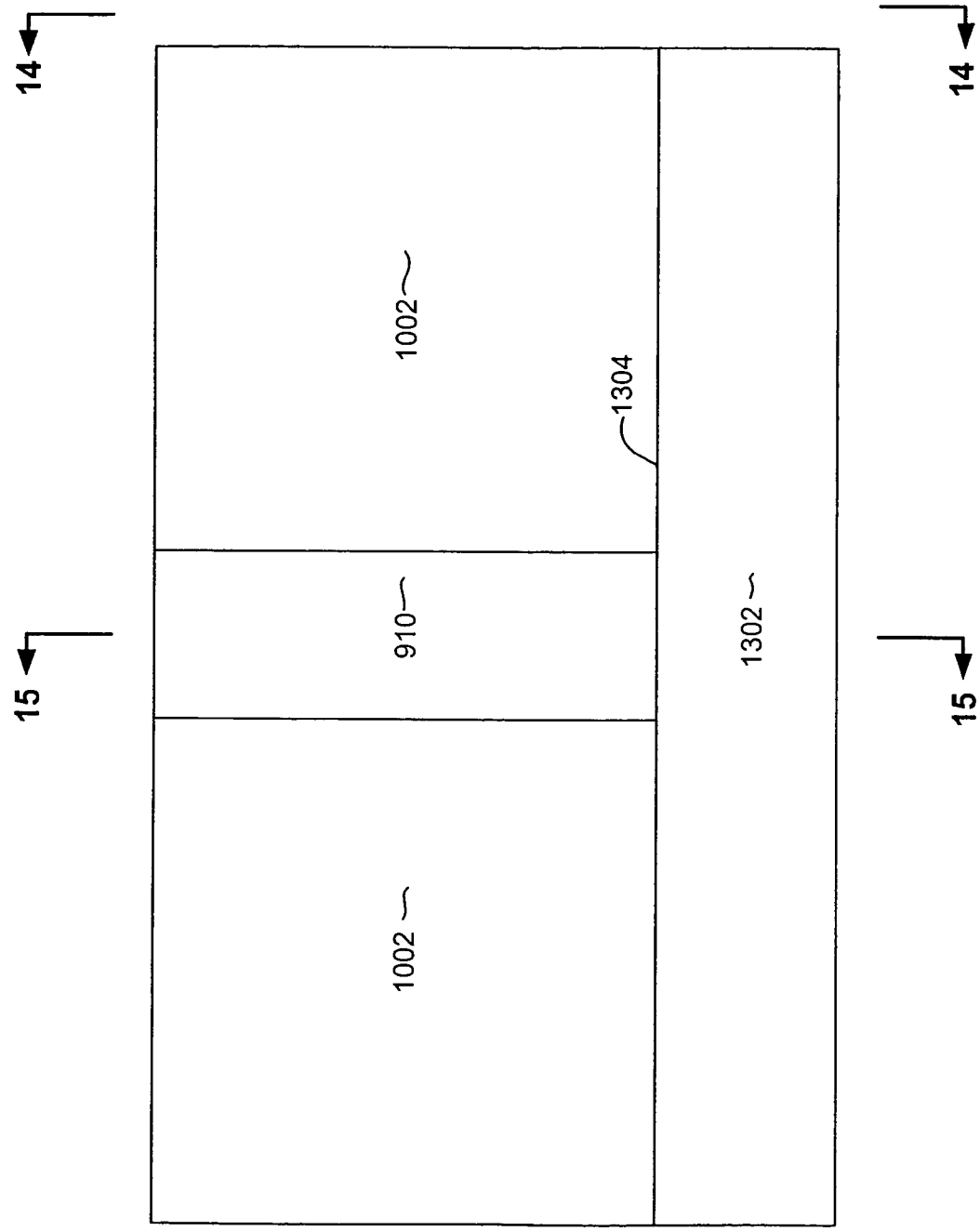

With reference now to FIG. 13, a third mask structure 1302 is formed. The third mask structure has a back edge 1304 that will define the stripe height of the active portion of the sensor. The third mask structure can be seen more clearly with reference to FIGS. 14A and 15A and includes: a CMP stop layer 1402, such as DLC; an image transfer layer 1404, such as DURIMIDE® and a photosensitive layer 1406, such as photoresist. The formation of the third mask structure includes the use of a reactive ion etch to transfer the image of the photoresist layer 1406 onto the underlying mask layers 1402, 1404. This RIE also removes the CMP stop layer 1004 from over the leads 1002, however the Rh RIE stop layer 910 remains in the track area.

Figure 14A:
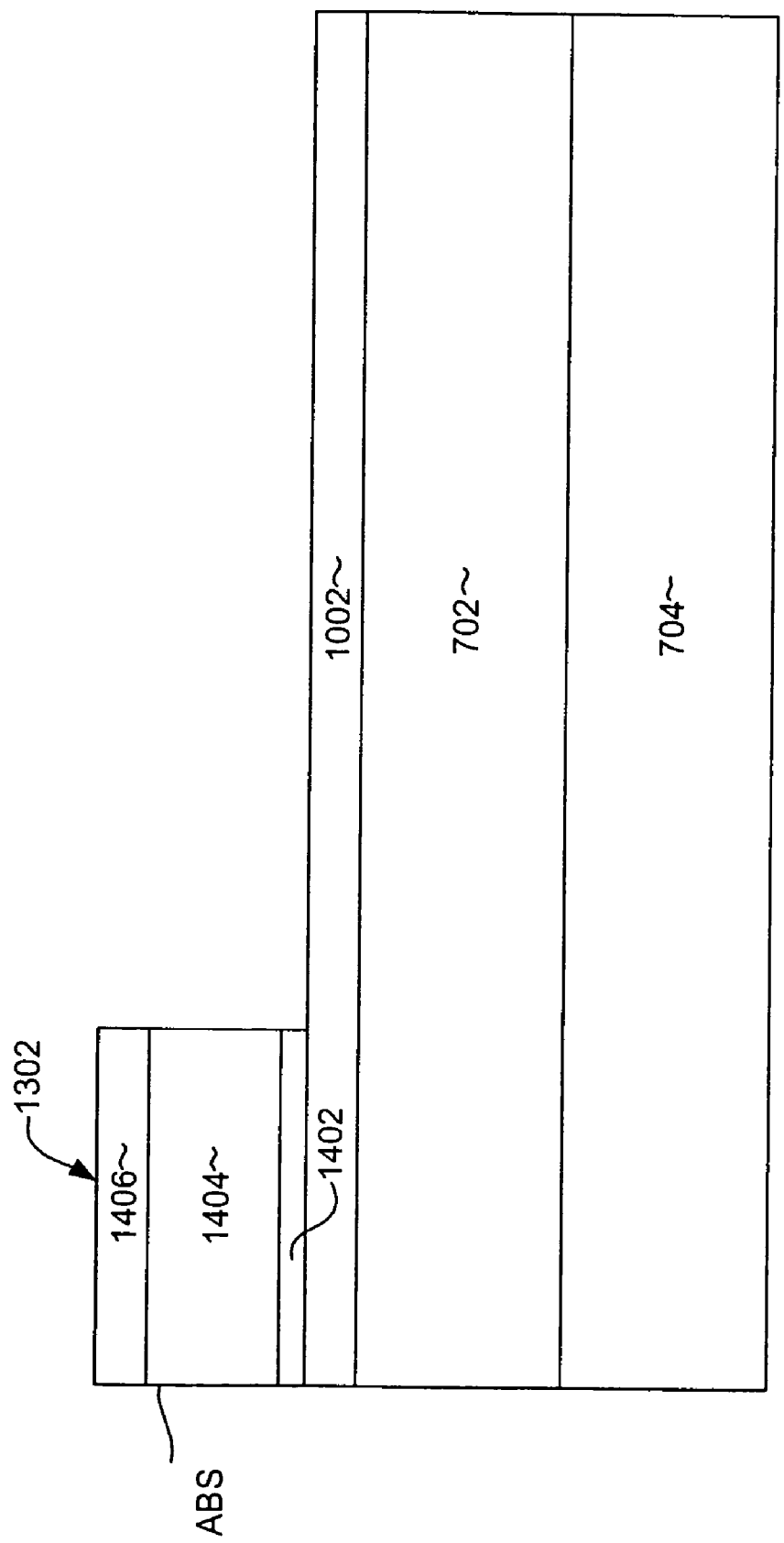
Figure 15A:
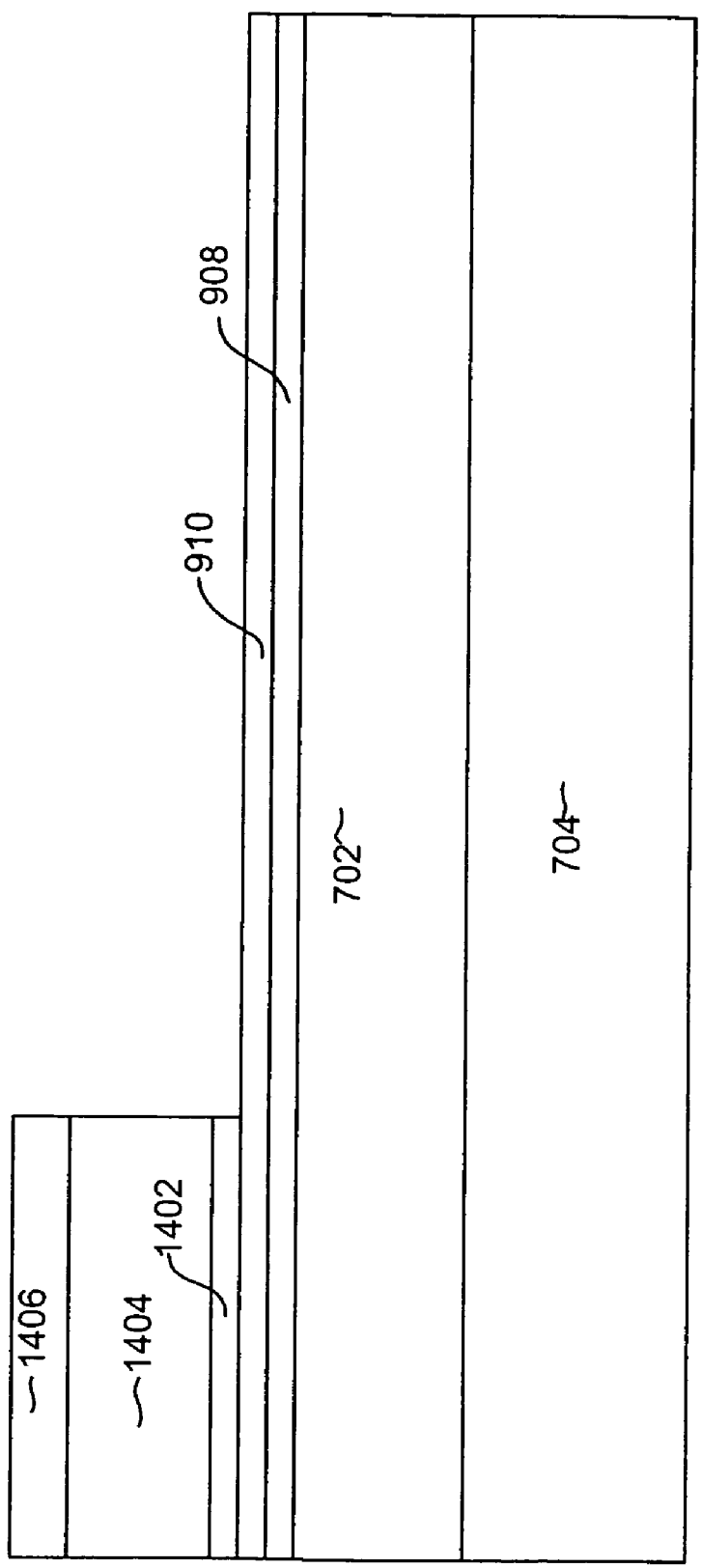

FIG. 14A shows the structure as viewed from the side in the region outside of the track width as indicated by line 14-14 of FIG. 13. FIG. 15A shows a cross section taken from the center of the structure within the track width region as indicated by line 15-15 of FIG. 13, and shows the remaining second mask structure 902 including the CMP stop layer 908 and RIE stop layer 910.

Figure 14B:
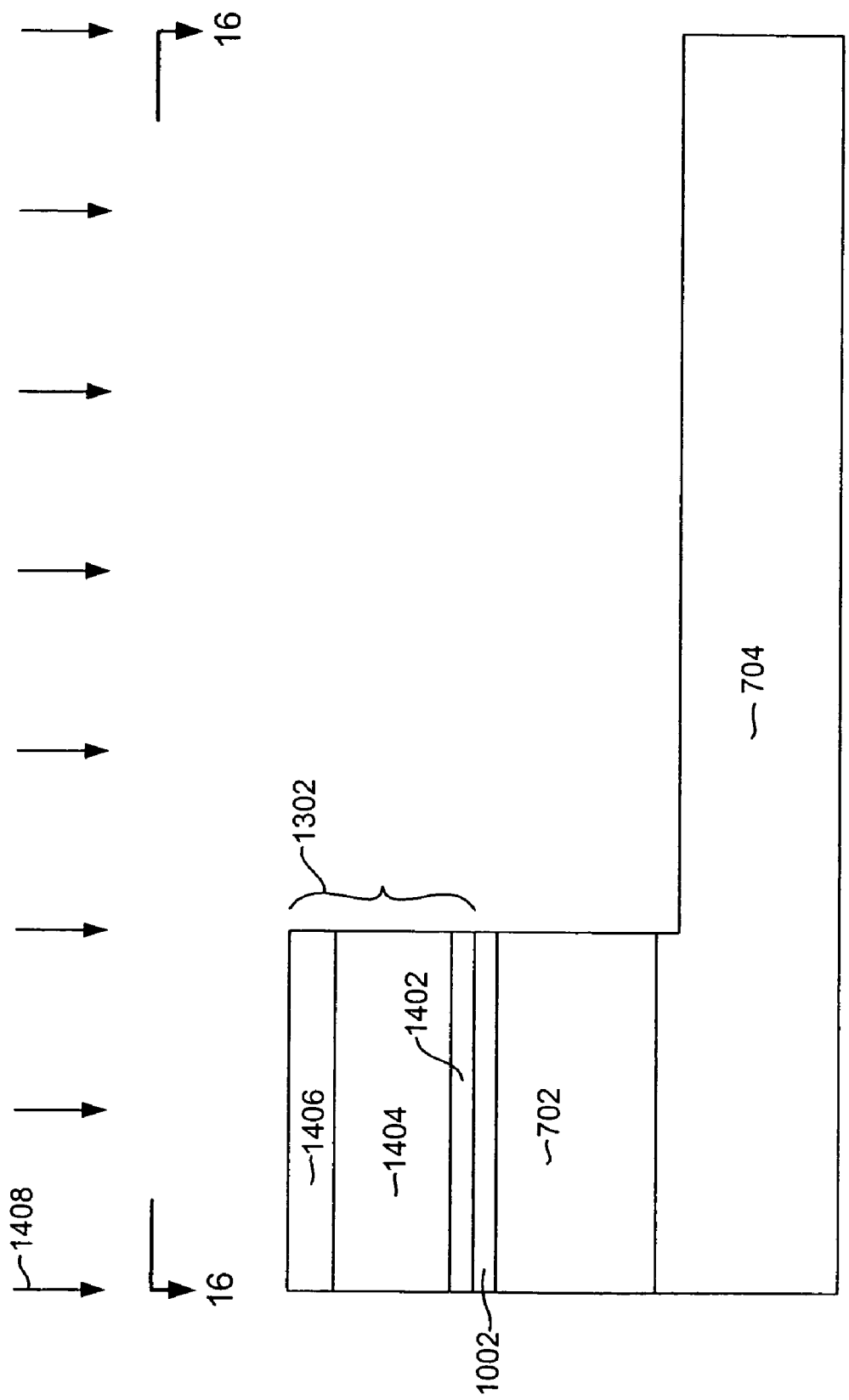
Figure 15B:
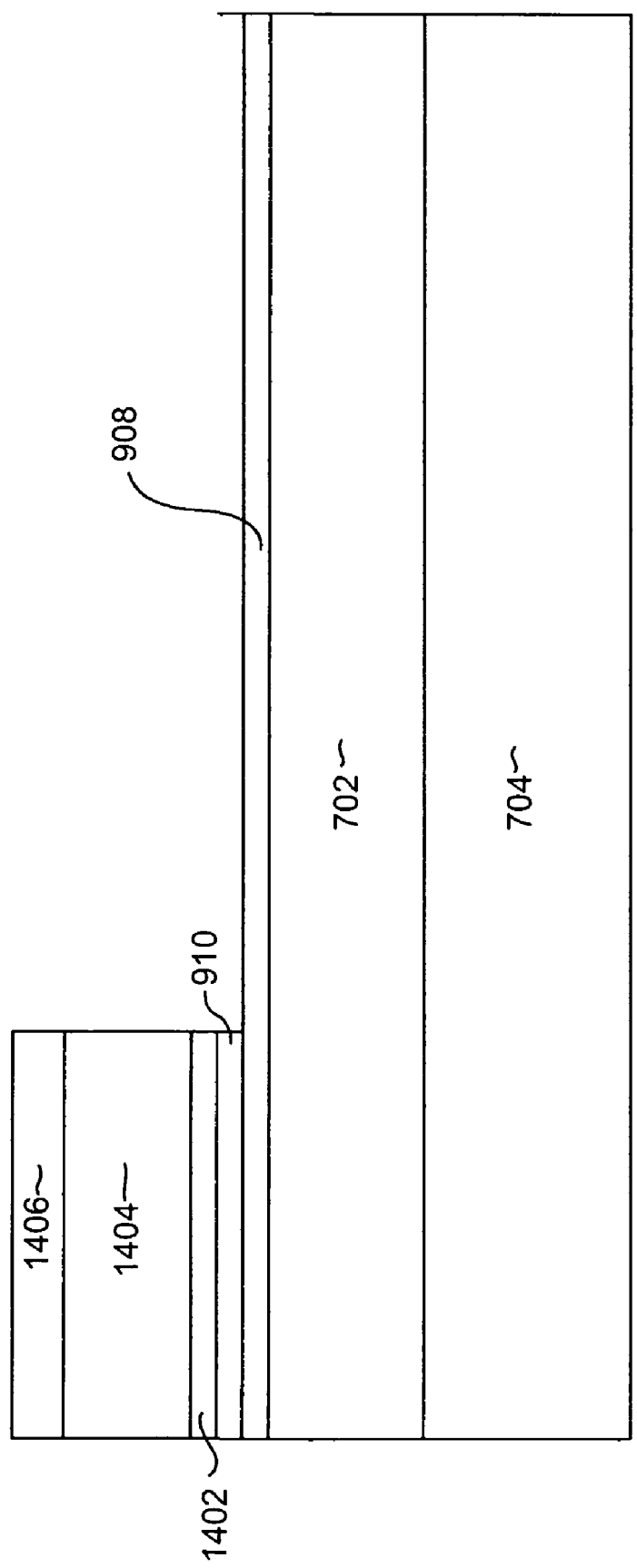
Figure 15C:
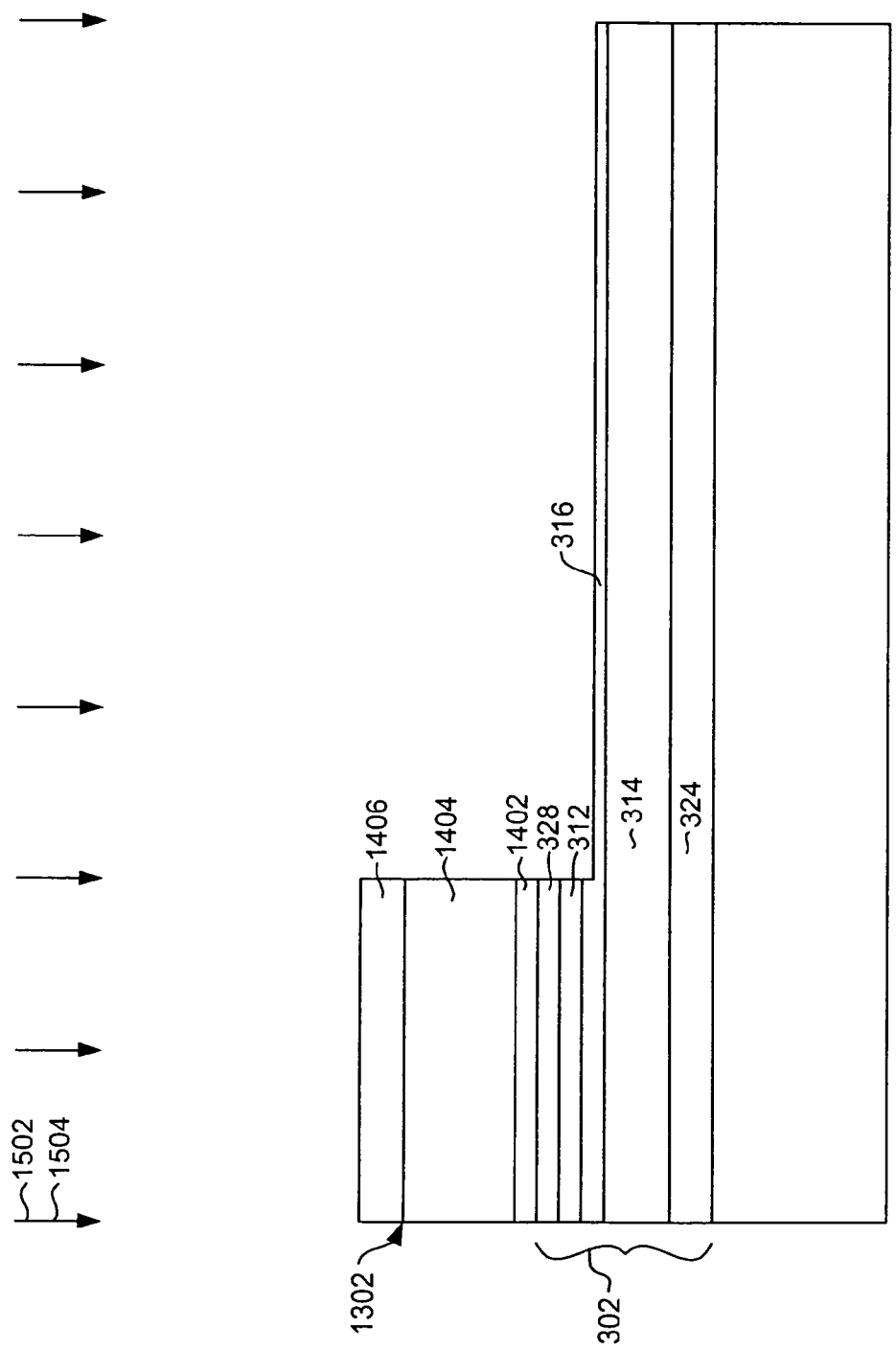
Figure 16:
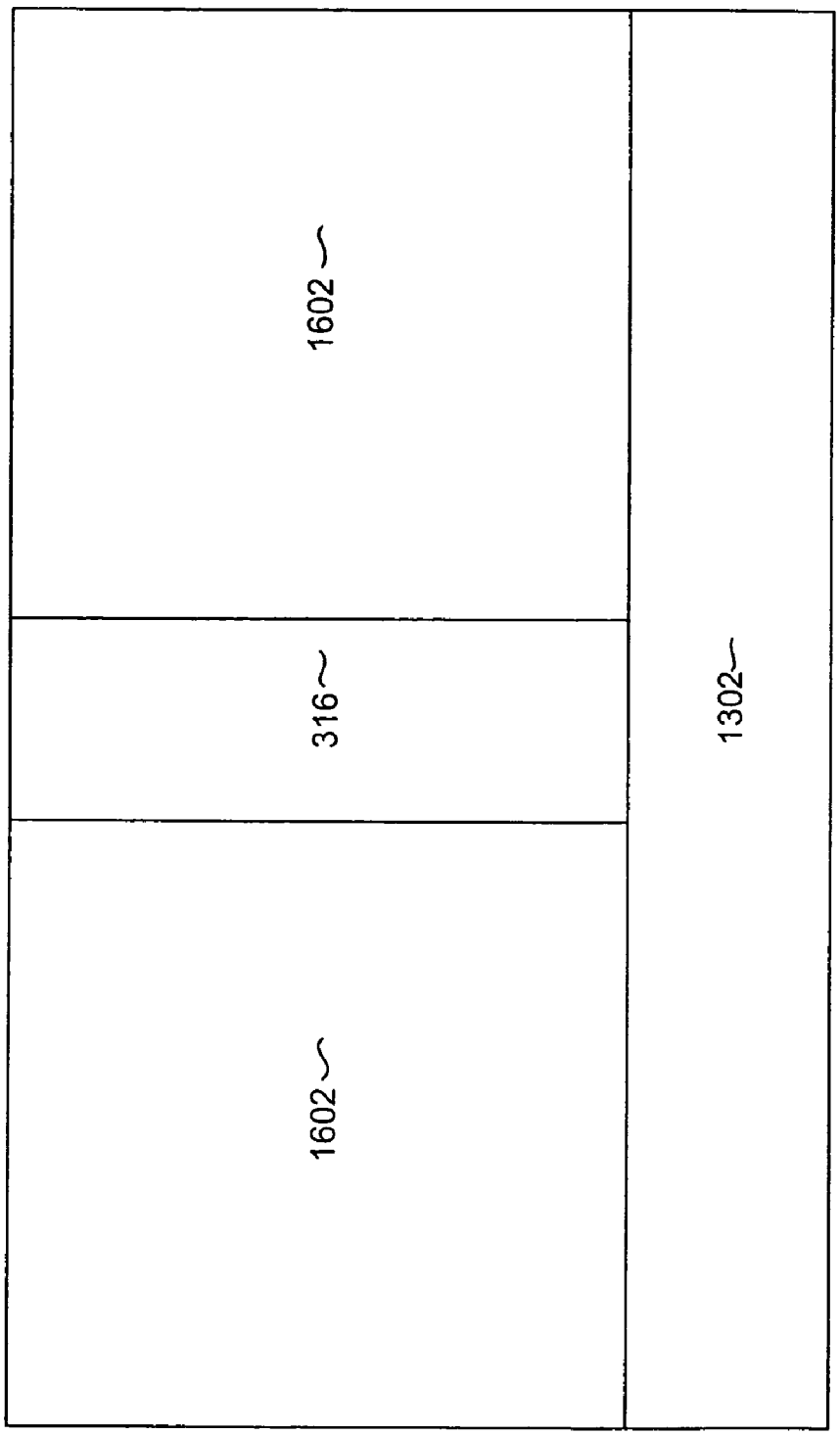

With reference now to FIGS. 14B and 15B, an ion mill is performed to remove lead and sensor material in areas not covered by the remaining second mask structure (layers 908, 910) and third mask structure 1302. FIG. 14B shows a section from outside the track and shows that the sensor material has been removed in these regions. FIG. 15B shows a section from within the track (from line 15-15 of FIG. 13). As can be seen in FIG. 15B, the sensor material remains under the CMP stop layer 908. The Rh layer is however removed by the ion mill. With reference to FIG. 15C, another RIE 1502 can be performed to remove the remaining CMP stop layer 908 from within the track layer in areas uncovered by the third mask 1302, and then a short ion mill 1504 can be performed to remove the cap layer 328, free layer 312 and possibly a portion of the spacer layer 316 from areas beyond the stripe height defined by the third mask 1302. In this way, the free layer can be removed, while leaving the pinned layer extending to the extended stripe height location defined in the first masking step (FIG. 8). The structure formed can be seen in a top down view in FIG. 16. An insulating fill layer 1602 can then be deposited. The fill layer 1602 can be, for example alumina ($Al_2O_3$) or some other non-magnetic, electrically insulating material, and is preferably deposited by atomic layer deposition or some other conformal deposition. The insulation layer is preferably deposited thick enough to completely fill the areas at either side of the track, and also to cover the remaining spacer 316 in the extended portion and pinned layer 314 hidden there under. The third mask structure 1302 can then be lifted off either by a chemical lift off process or by a physical lift process such as chemical mechanical polishing.

Figure 17:
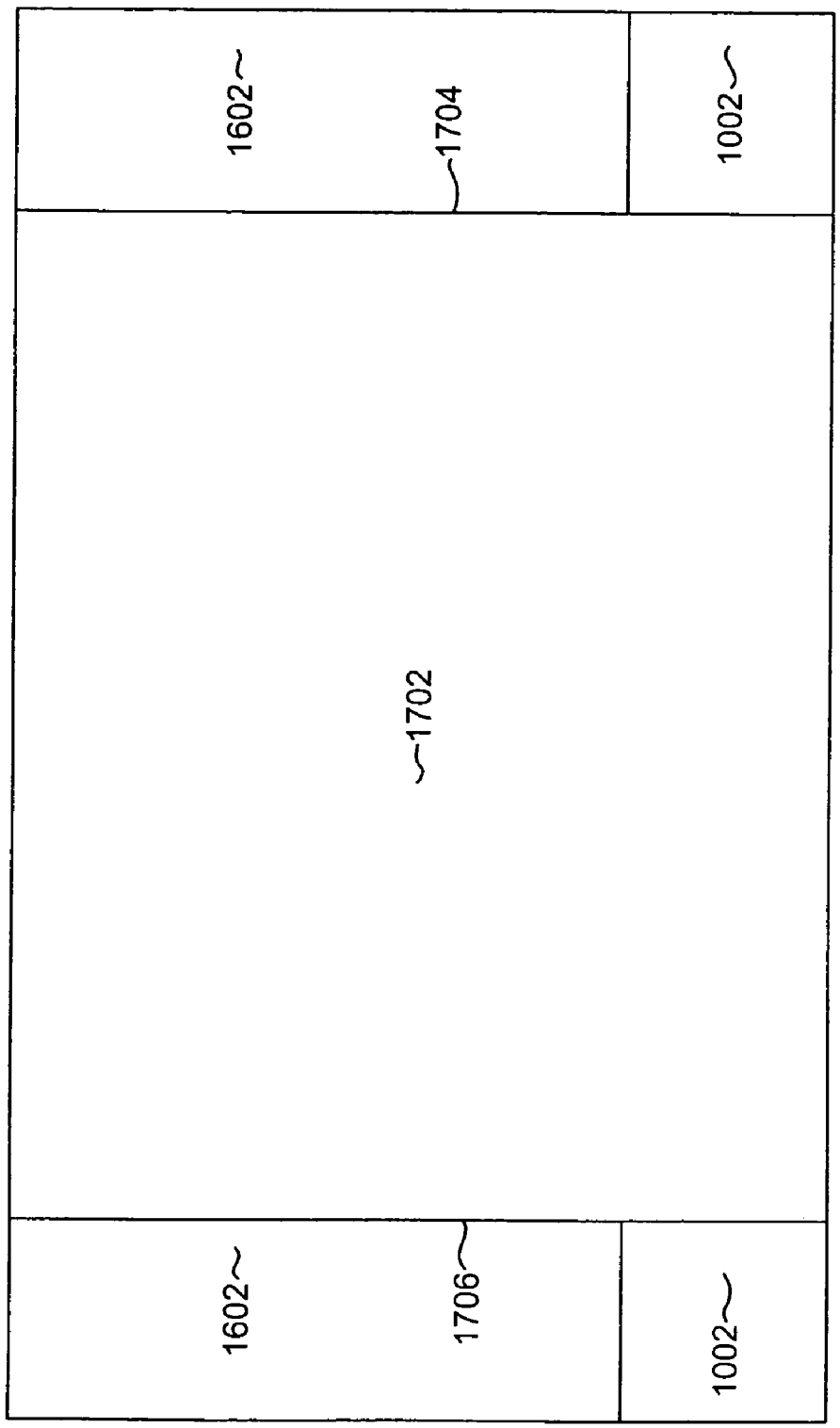

With reference now to FIG. 17, a fourth mask structure 1702 is deposited. The mask structure 1702 can include a layer of diamond like carbon, an image transfer layer such as DURIMIDE® and a patterned photoresist layer. The mask structure 1702 has first and second laterally opposed sides 1704, 1706. The sides 1704, 1706 define the outermost width of the sensor layer stack 302 (FIG. 3) after completion of the sensor. In FIG. 17 it can be seen that portions of the first lead layers 1002, and the insulation layer 1602 extend beyond the sides 1704, 1706 of the fourth mask structure 1702.

Figure 18A:
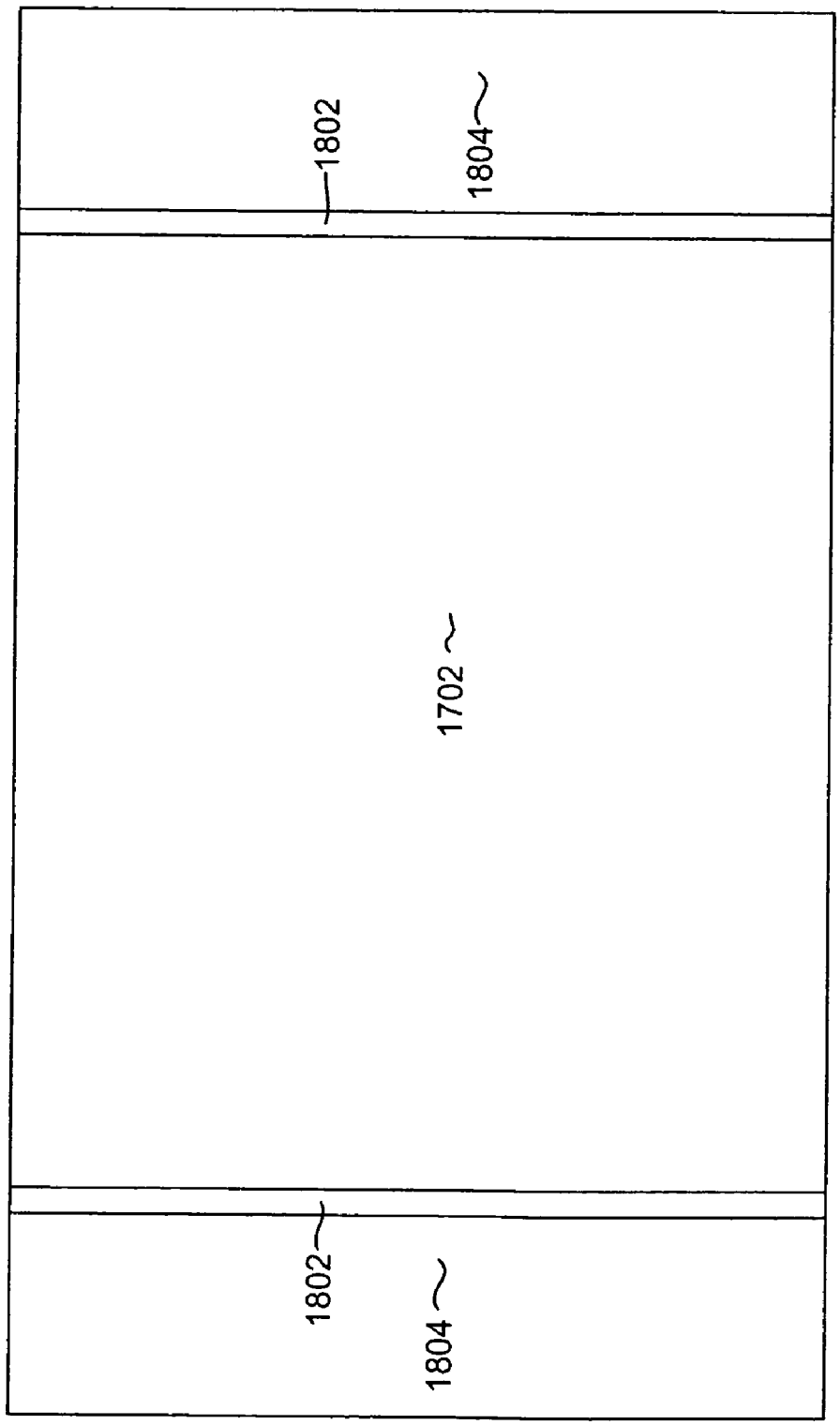
Figure 18B:
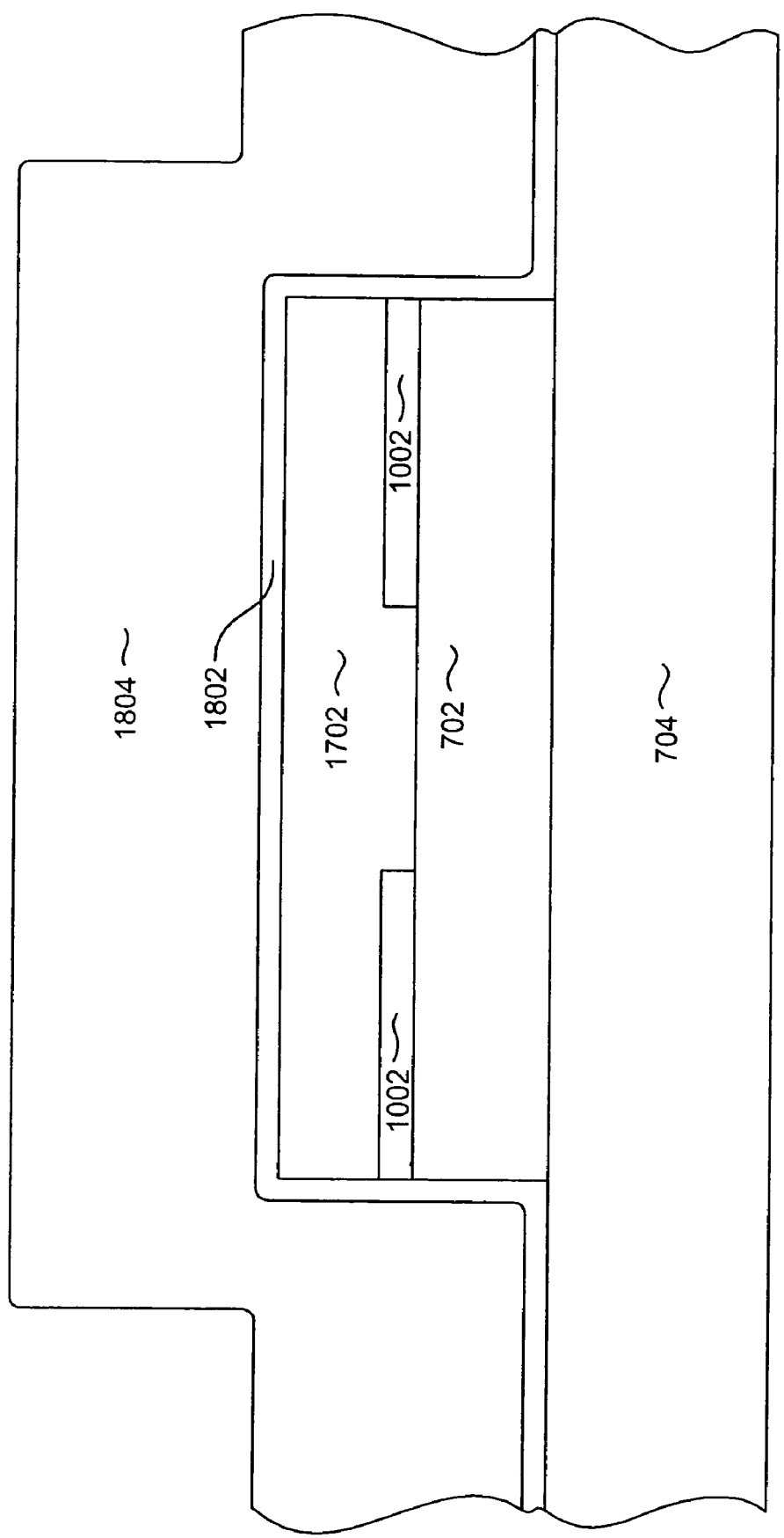

With reference to FIGS. 18A and 18B, an ion mill can be performed to remove these exposed portions of the first lead layers 1002 and insulation layer 1602 that extend beyond the sides 1704, 1706 of the fourth mask structure 1702. Then, thin layer of conformally deposited insulation material 1802 can then be deposited, followed by a layer of hard magnetic material 1804. The insulation layer 1802 can be, for example, alumina ($Al_2O_3$) or some other non-magnetic, electrically insulating material, and is preferably deposited by a conformal deposition method such as atomic layer deposition, chemical vapor deposition, etc. The conformal deposition of the insulation layer 1802 results in an insulation layer that covers the sides of the sensor stack, 702, and also extends over the substrate 704. The hard magnetic material 1804 can be, for example, CoPt, CoPtCr or some other hard magnetic material.

Figure 19:
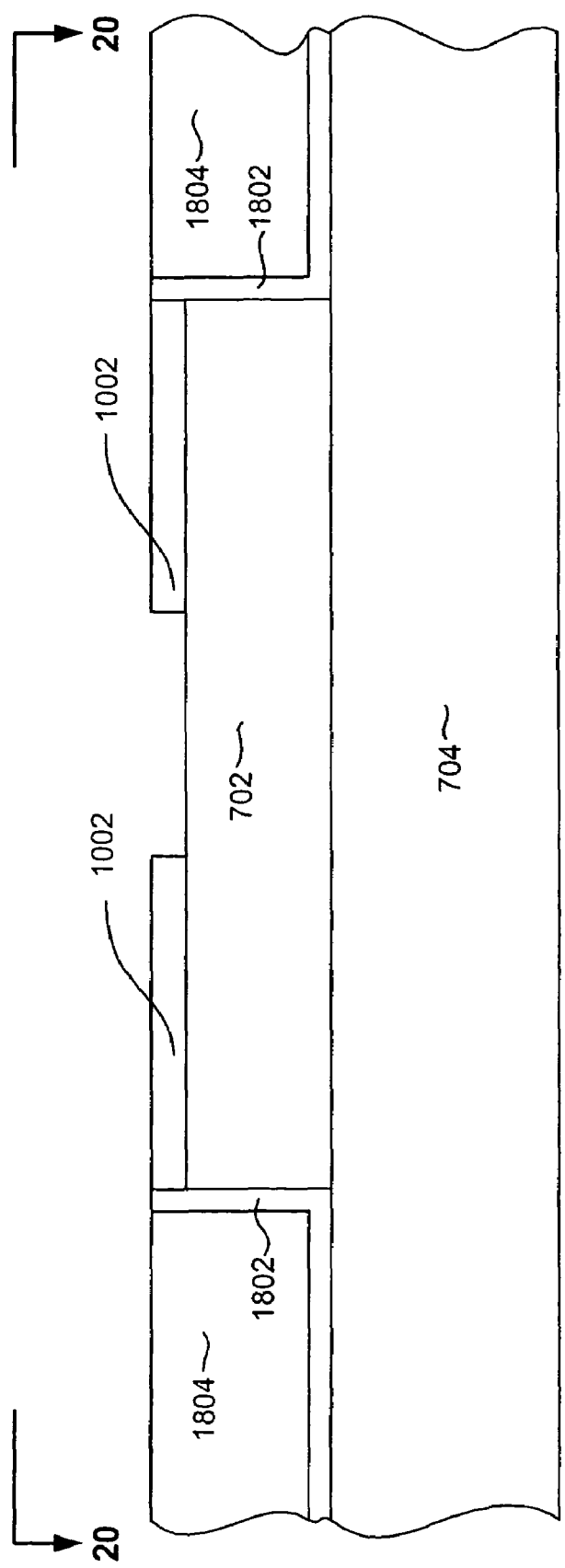

With reference to FIG. 19, a chemical mechanical polishing process (CMP) can be performed to planarize the hard bias material 1804, and insulation layer 1802, and to remove the fourth mask structure 1702.

Figure 20:
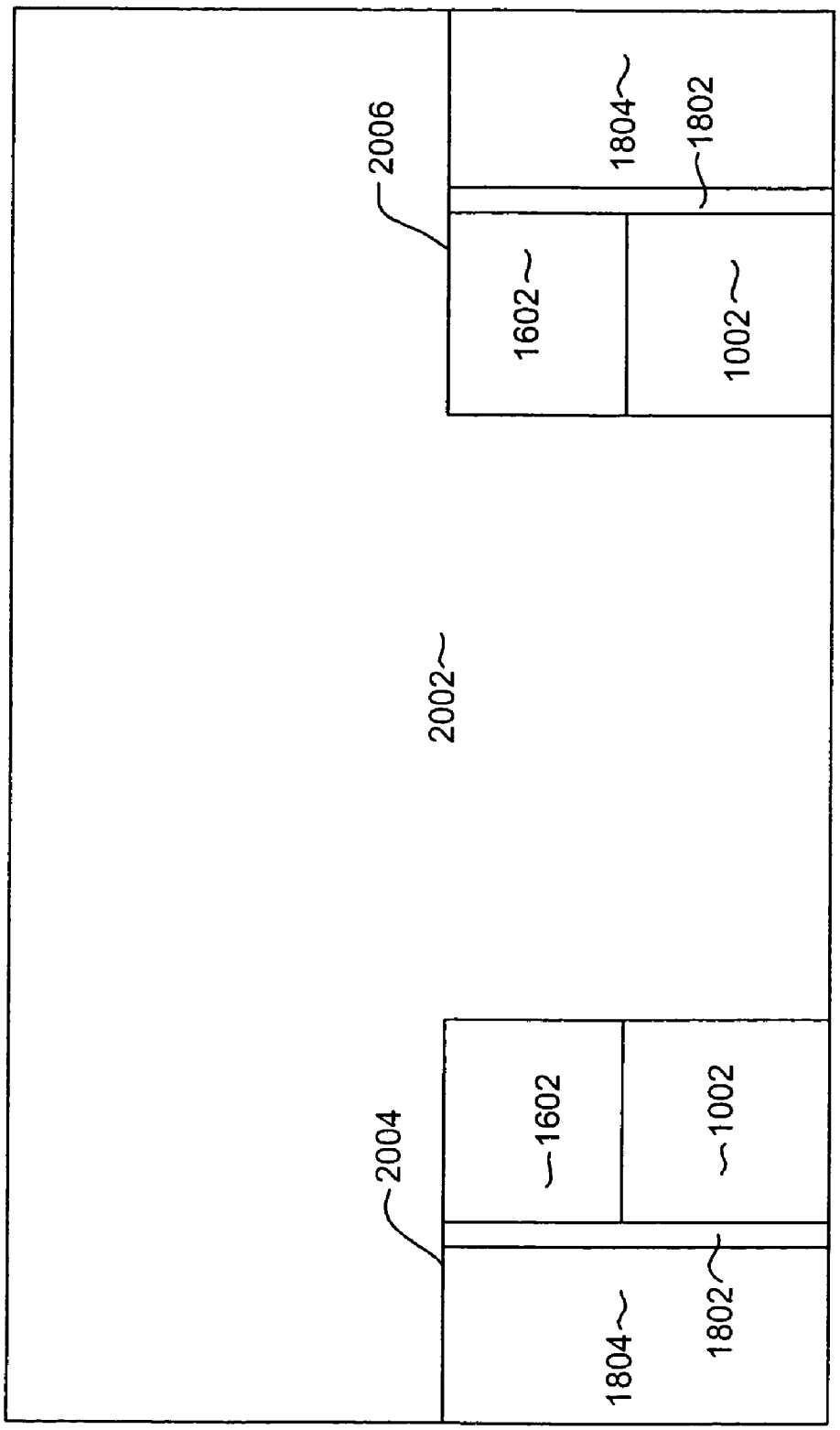
Figure 21:
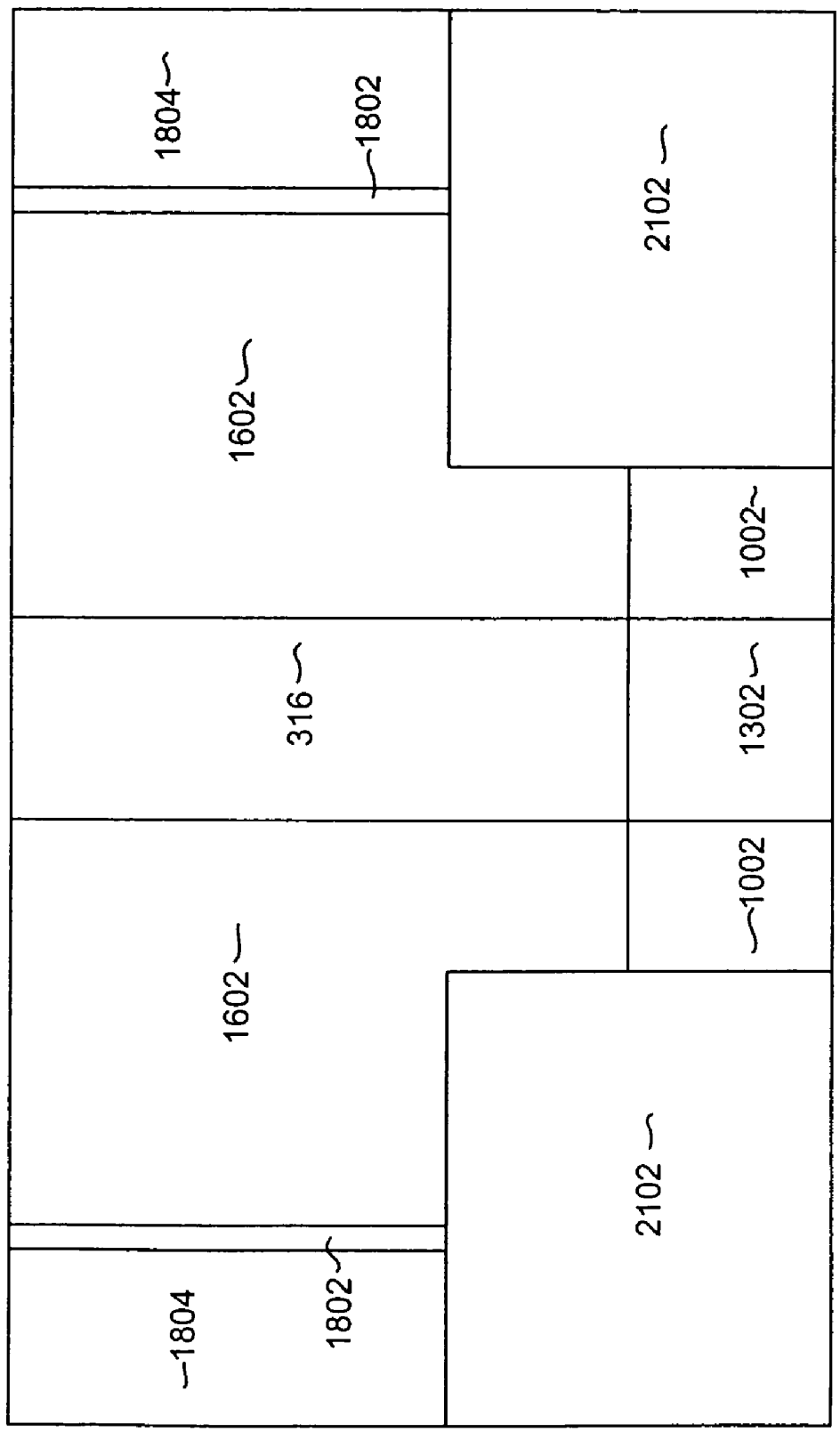

With reference now to FIG. 20, a fifth mask structure 2002 is formed. This mask structure 2002 has first and second openings 2004, 2006 that expose a portion of the hard bias layer 1804, insulation 1802 first lead layer 1002 and insulation layer 1602 near the ABS location. The opening can be in the form of a square or rectangle, and is configured with a shape to define the second lead layers 336 described in FIG. 3. With reference to FIG. 21, a layer of electrically conductive lead material 2102 is deposited into the openings 2004, 2006 in the fifth mask structure 2002 to form the leads 336 of FIG. 3. The mask 2002 can then be lifted off, resulting in the structure shown in FIG. 21. A layer of electrically insulating, non-magnetic material (not shown) can then be deposited to complete the formation of the sensor 300 shown in FIG. 3.

Figure 22:
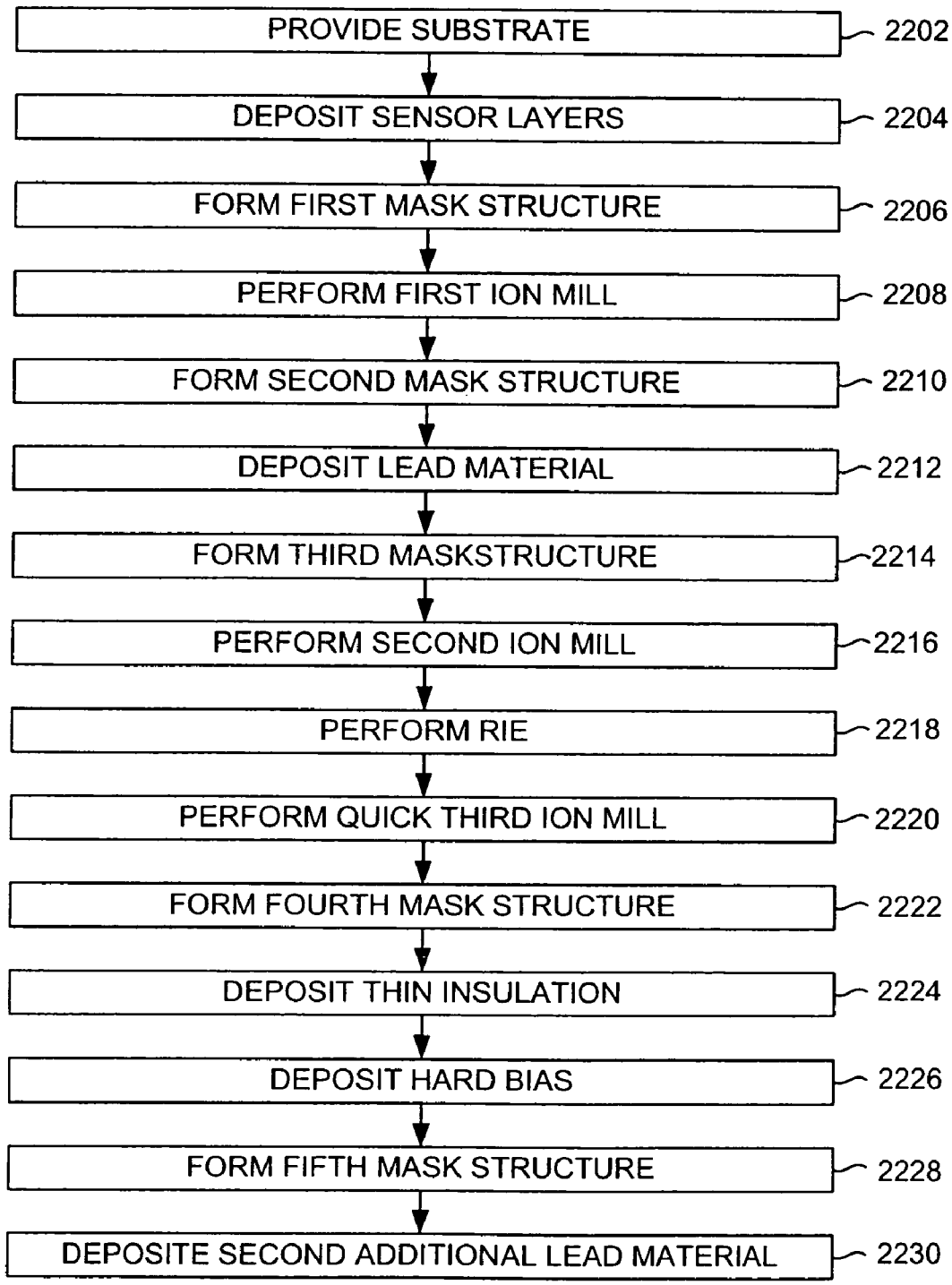
FIG. 22 is a flowchart illustrating a method of using a multiuse mask structure to construct a device according to an embodiment of the invention.

With reference now to FIG. 22, a method for constructing a sensor according to an embodiment of the invention includes, in a step 2202, providing a substrate. Then, in a step 2204, a plurality of sensor layers 702 (FIG. 8) is deposited onto the substrate. The sensor layers may include a pinned layer structure, free layer and a non-magnetic spacer layer sandwiched between the free and pinned layers. In a step 2206, a first mask structure 802 (FIG. 8) is formed, having a back edge at a distant stripe height location to define the back edge of the pinned layer 314 (FIG. 4) in the final sensor 300. In, a step 2208 a first ion mill can be performed to remove sensor material not covered by the first mask structure. The first mask can then be removed.

In a step 2210, a second mask structure can be formed. The second mask structure 902 (FIG. 9) may include a CMP stop (such as diamond like carbon), a RIE stop (such as Rh), an image transfer layer (such as DURIMIDE®), and a photosensitive layer (such as photoresist). The second mask structure has first and second sides that define a track width of the sensor 300. Then, in a step 2212 a layer of electrically conductive lead material can be deposited. A layer of CMP stop material, such as diamond like carbon (DLC) may also be deposited. In a step 2214 a third mask structure 1302 (FIG. 14A) is formed having a back edge that defines an active area of the sensor in the stripe height direction. Then, in a step 2216 a second ion mill is performed to remove lead and sensor material not covered by the second and third mask structures. In a step 2218, a RIE can be performed to remove portions of the CMP stop layer of the second mask structure that extend beyond the third mask structure. Then, in a step 2220 a quick third ion mill can be performed to remove portions of the free layer that extend beyond the third mask structure. An electrically insulating fill material, such as alumina, is deposited to fill the space left by the removed lead and sensor material. The third mask can then be removed.

Then, in a step 2222 a fourth mask structure can be formed having a width that is significantly wider than the second mask structure. A fourth ion mill can be performed to remove lead, sensor and insulation material not covered by the fourth mask. Then, in a step 2224 a thin layer of conformally deposited insulation material, such as alumina can be deposited. Then, in a step 2226 a layer of hard magnetic material such as CoPt or CoPtCr can be deposited. The fourth mask can then be lifted off. In a step 2228 a fifth mask structure can be formed having a width that is between that of the second and fourth mask structures. Then, in a 2230 a second layer of lead material can be deposited.

The resulting sensor structure, shown with reference to FIGS. 3-6, provides several advantages over previous magnetoresistive sensors. For example, during the ion milling processes used to form the outer edges of the sensor, a certain amount of damage inevitably occurs to the sensor layers at the outer edge of the sensor stack 302. However, the effective track width in a lead overlay sensor according to the present invention is removed from the actual outer edges of the sensor stack 302 in the active area of the sensor. Therefore, the effect of such damage at the outer edges 330, 332 is mitigated by removing it from the active area of the sensor. Moving the outer edges 330, 332 of the sensor stack 302 outside of the active area (beyond the TW) also improves free layer sensitivity in the active area of the sensor. The hard bias layers 305, 307 provide magnetic biasing to the free layer 312 by magnetostatically coupling with the outer edges of the free layer 312. However, such biasing results in pinning or near pinning of the free layer 312 at the outer edges 330, 332. Moving this pinned region of the free layer 312 outside of the active area of the sensor improves free layer sensitivity in the active area of the sensor.

Another advantage to a sensor according to the present invention is that the thin leads define the effective track width of the sensor 300 and can be easily photolithgraphically patterned. Because the thin leads 334 are very thin, the mask structure 902 (FIG. 9) used to define the leads can be much thinner and more accurately photolithographically patterned than a mask structure that would be used to defining the width of an entire sensor stack in a prior art sensor design. Therefore, the distance between the inner portion of the first leads 334 can be accurately patterned to a very narrow width. The insulation layers 309, 311 that separate the hard bias layers 305, 307 from the sides 330, 332 of the sensor stack prevent sense current from leaking from the hard bias layers 305, 307 to the sensor stack 302. This channels the sense current through the leads to more accurately define the track width.

With reference to FIG. 4, it can be seen that the pinned layer 314 extends much further in the stripe height direction (ie. away from the ABS) than the rest of the sensor stack 302. This extension of the pinned layer 314 provides a strong magnetic anisotropy that greatly improves the pinning of the pinned layer 314. This shaped induced anisotropy can be several hundred Oe or larger. Furthermore, this strong magnetic anisotropy is advantageously unaffected by other factors such as the size of the sensor or by mechanical stresses. What's more, this anisotropy is completely additive to other pinning mechanisms such as AP pinning, AFM pinning or pinning with a hard magnet.

In a similar manner, the free layer has a shape enhanced anisotropy parallel to the ABS (ie. perpendicular to that of the pinned layer). As can be seen with reference to FIGS. 3 and 4, the free layer is much wider in the track width direction than it is in the stripe height direction. A free layer 312 having this shape has a magnetic anisotropy in a direction parallel with the ABS, (ie. left to right in FIG. 3) that may improve free layer stability.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor having an air bearing surface (ABS), comprising:
a sensor stack including a pinned layer, a free layer and a non-magnetic, electrically conductive spacer layer sandwiched between the free layer and the pinned layer;
first and second leads formed over the sensor stack and terminating at inner edges that determine a first width;
wherein the sensor stack extends laterally, terminating at first and second laterally opposed sides that define a second width that is larger than the first width; and
first and second hard bias layers located adjacent to the first and second laterally opposed sides of the sensor stack;
wherein the free layer terminates at a stripe height distance as measured from the ABS; and
the pinned has an extended portion that extends beyond the first stripe height distance to a second stripe height distance that is greater than the first stripe height distance as measured from the ABS.

2. A sensor as in claim 1 wherein the pinned layer has a lateral width beyond the first stripe height distance that is substantially equal to the first width defined by the inner edges of the first and second leads.

3. A sensor as in claim 1 wherein the pinned layer has a lateral width beyond the first stripe height distance that is substantially equal to the first width defined by the inner edges of the first and second leads and extends to the laterally opposed sides of the sensor stack in a region between the ABS and the first strip height.

4. A sensor as in claim 1 wherein further comprising first and second non-magnetic, electrically insulating layers separating the hard bias layers from the laterally opposed sides of the sensor stack.

5. A sensor as in claim 1 further comprising a layer of, electrically insulating material contacting each of the laterally opposed sides of the sensor stack, the electrically insulating material being disposed between the side of the sensor stack and the adjacent hard bias layer.

6. A sensor as in claim 1 further comprising a layer of conformally deposited alumina contacting each of the laterally opposed sides of the sensor stack, the layer of conformally deposited alumina being disposed between the side of the sensor stack and the adjacent hard bias layer.

7. A sensor as in claim 6 wherein the conformally deposited alumina is deposited by chemical vapor deposition.

8. A sensor as in claim 6 wherein the conformally deposited alumina is deposited by atomic layer deposition.

9. A sensor as in claim 1 wherein each of the first and second lead layers includes a thin bottom lead and a thicker top lead, the thin bottom lead extending from the inner lead edge to the side of the sensor stack, the top lead extending over a portion of the bottom lead and over at least a portion of the hard bias layers.

10. A sensor as in claim 1 wherein the second stripe height distance is at least twice the first stripe height distance.

11. A magnetoresistive sensor having an air bearing surface (ABS), comprising:
a sensor stack having a free layer, a pinned layer and a non-magnetic electrically conductive spacer layer sandwiched between the free layer and the pinned layer, the sensor stack having first and second laterally opposed sides and a surface extending from between the first and second laterally opposed sides;
first and second electrically conductive leads formed over a portion of the surface of the sensor stack;
wherein:
the first and second leads are separated from one another by a first width W1,
the first and second sides of the sensor stack are separated from one another by a second width W2, W2 being greater than W1;
the sensor stack has a first stripe height SH1 measured from the ABS; and
a portion of the pinned layer extends beyond SH1 to a second stripe height SH2 measured from the ABS.

12. A sensor as in claim 11, wherein W2 is at least 1.5 times W1.

13. A sensor as in claim 11 wherein W2 is 2-4 times W1.

14. A sensor as in claim 11 wherein SH2 is larger than SH1.

15. A sensor as in claim 11 wherein SH2 is at least two times SH1.

16. A sensor as in claim 11 wherein W2 is at least 1.5 times SH1.

17. A sensor as in claim 11 wherein W2 is 2-5 times SH1.

18. A sensor as in claim 11 further comprising first and second hard bias layers extending from the first and second sides of the sensor stack.

19. A sensor as in claim 11 further comprising first and second hard bias layers extending from the first and second sides of the sensor stack, the hard bias layers being separated from the sensor stack by first and second insulation layers.

20. A sensor as in claim 11 wherein the first and second insulation layers are a conformally deposited material.

21. A sensor layer as in claim 11 wherein the first and second insulation layers comprise alumina.

22. A sensor as in claim 11 wherein the portion of the pinned layer that extends beyond the first stripe height SH1 has a width that is substantially the same as the distance W1 between the first and second leads.

23. A sensor as in claim 11, wherein the first and second leads terminate at inner ends separated by the distance W1, and wherein the portion of the pinned layer that extends beyond the stripe height SH1 has first and second sides that are substantially laterally aligned with the inner edges of the first and second leads.

24. A sensor as in claim 11, wherein each of the first and second leads includes a thin bottom layer and a thicker top layer, each thin bottom layer extending from the inner edge of the lead to the side of the sensor stack, the top lead extending over at least a portion of the first lead layer and over at least a portion of one of the hard bias layers.

25. A sensor as in claim 24 wherein the bottom lead terminates at the stripe height SH1 and the top lead extends beyond SH1.

26. A magnetic disk drive system, comprising:
a housing;
a magnetic disk rotatably mounted within the housing;
an actuator;
a slider, having an air bearing surface and connected with an end of the actuator for movement adjacent to a surface of the magnetic disk; and
a magnetoresistive sensor connected with the slider, the sensor comprising:
a sensor stack having a free layer, a pinned layer and a non-magnetic electrically conductive spacer layer sandwiched between the free layer and the pinned layer, the sensor stack having first and second laterally opposed sides and a surface extending from between the first and second laterally opposed sides;
first and second electrically conductive leads formed over a portion of the surface of the sensor stack;
wherein:
the first and leads are separated from one another by a first width W1,
the first and second sides of the sensor stack are separated from one another by a second width W2, W2 being greater than W1;
the sensor stack has a first stripe height SH1 measured from the ABS; and
a portion of the free layer extends beyond SH1 to a second stripe height SH2 measured from the ABS.

27. A disk drive as in claim 26, wherein W2 is at least 1.5 times W1.

28. A disk drive as in claim 26 wherein W2 is 2-4 times W1.

29. A disk drive as in claim 26 wherein SH2 is larger than SH1.

30. A disk drive as in claim 26 wherein SH2 is at least two times SH1.

31. A disk drive as in claim 26 wherein W2 is at least 1.5 times SH1.

32. A disk drive as in claim 26 wherein W2 is 2-5 times SH1.

33. A method for constructing a magnetoresistive sensor, comprising:
providing a substrate
depositing a plurality of sensor layers on the substrate, the sensor layers including a magnetic pinned layer structure, a free layer structure and a non-magnetic layer sandwiched between the free layer and pinned layer structure;
forming a first mask structure, the first mask structure having first and second lateral sides that are spaced apart a first distance, the first mask structure including a layer of material that is resistant to chemical mechanical etching (CMP stop layer), a second layer that is resistant to removal by reactive ion etching (RIE stop layer) formed over the CMP stop layer; an image transfer layer formed over the RIE stop layer and a layer of photosensitive material formed over the image transfer layer;
depositing a layer of electrically conductive material to form thin leads;
forming a second mask structure having an edge located at a stripe height dimension defining an active sensor area, the second mask structure extending beyond the laterally opposed sides of the first mask structure; and
performing an ion mill to remove portions of the electrically conductive lead material and sensor layer material that are not covered by the first and second mask structure.

34. A method for constructing a magnetoresistive sensor, comprising:
providing a substrate;
depositing a plurality of sensor layers on the substrate, the sensor layers including a pinned layer a free layer and a non-magnetic layer sandwiched between the pinned layer and the free layer;
determining an intended ABS location, a first stripe height location and a second stripe height location, the distance between the ABS and the second stripe height location being greater than the distance between the ABS and the first stripe height location;
forming a first mask structure having an edge terminating at the second stripe height location;
performing a first ion mill to remove portions of the deposited sensor material that are not covered by the first mask structure;
removing the first mask structure;
forming a second mask structure, the second mask structure having first and second laterally opposed sides spaced apart by a distance to define a sensor track width;
depositing an electrically conductive lead material;
forming a third mask structure having an edge terminating at the first stripe height location; and
performing a second ion mill to remove lead and sensor material not covered by the second and third mask structures.

* * * * *